US008179050B2

(12) United States Patent
Chen

(10) Patent No.: US 8,179,050 B2
(45) Date of Patent: May 15, 2012

(54) HELICON PLASMA SOURCE WITH PERMANENT MAGNETS

(75) Inventor: Francis F. Chen, Los Angeles, CA (US)

(73) Assignee: The Regents Of The University of California, Oakland, CA (US)

(*) Notice: Subject to any disclaimer, the term of this patent is extended or adjusted under 35 U.S.C. 154(b) by 1118 days.

(21) Appl. No.: 12/003,330

(22) Filed: Dec. 21, 2007

(65) Prior Publication Data

US 2008/0246406 A1 Oct. 9, 2008

Related U.S. Application Data

(63) Continuation-in-part of application No. PCT/US2006/024565, filed on Jun. 23, 2006.

(60) Provisional application No. 60/693,054, filed on Jun. 23, 2005, provisional application No. 60/801,051, filed on May 18, 2006, provisional application No. 60/924,382, filed on May 11, 2007.

(51) Int. Cl.
*H01J 7/24* (2006.01)

(52) U.S. Cl. ........... 315/111.41; 118/723 I; 156/345.49

(58) Field of Classification Search ............. 118/723 R, 118/723 I; 156/345.48, 345.49; 315/34, 315/111.01, 111.11, 111.21, 111.41, 344
See application file for complete search history.

(56) References Cited

U.S. PATENT DOCUMENTS

| 4,990,229 | A | | 2/1991 | Campbell et al. |
| 5,091,049 | A | | 2/1992 | Campbell et al. |
| 5,122,251 | A | | 6/1992 | Campbell et al. |
| 5,421,891 | A | | 6/1995 | Campbell et al. |
| 5,429,070 | A | | 7/1995 | Campbell et al. |
| 5,567,268 | A | * | 10/1996 | Kadomura ............... 156/345.28 |
| 6,087,778 | A | | 7/2000 | Benjamin et al. |
| 6,189,484 | B1 | * | 2/2001 | Yin et al. ................ 118/723 I |
| 6,264,812 | B1 | | 7/2001 | Raaijmakers et al. |
| 6,297,594 | B1 | * | 10/2001 | Sakai et al. ............. 315/111.41 |
| 6,338,313 | B1 | | 1/2002 | Chan |
| 6,352,049 | B1 | * | 3/2002 | Yin et al. ................ 118/723 MP |
| 6,635,578 | B1 | | 10/2003 | Xu et al. |
| 6,771,026 | B2 | | 8/2004 | Vukovic |
| 6,876,154 | B2 | * | 4/2005 | Appleyard ............... 315/111.21 |
| 2002/0029850 | A1 | | 3/2002 | Chan |
| 2002/0185226 | A1 | * | 12/2002 | Lea et al. ................ 156/345.35 |
| 2003/0029837 | A1 | | 2/2003 | Trow |
| 2003/0218430 | A1 | | 11/2003 | Leung et al. |

OTHER PUBLICATIONS

R.W. Boswell, Plasma production using a standing helicon wave, Phys. Lett. A 33, 457 (1970).
F.F. Chen and D.D. Blackwell, Upper limit to Landau damping in helicon discharges, Phys. Rev. Lett. 82, 2677 (1999).
F.F. Chen, Plasma ionization by helicon waves, Plasma Phys. Control. Fusion 33, 339 (1991).
F.F. Chen, Helicon Plasma Sources, in "High Density Plasma Sources", ed. by Oleg A. Popov (Noyes Publications, Park Ridge, NJ), Chap. 1 (1995).
R.W. Boswell and F.F. Chen, Helicons, the early years, IEEE Trans. Plasma Sci. 25, 1229 (1997).

(Continued)

*Primary Examiner* — Thuy Vinh Tran
(74) *Attorney, Agent, or Firm* — Venable LLP; Henry J. Daley

(57) ABSTRACT

A helicon plasma source has a discharge tube, a radio frequency antenna disposed proximate the discharge tube, and a permanent magnet positioned with respect to the discharge tube so that the discharge tube is in a far-field region of a magnetic field produced by the permanent magnet.

20 Claims, 28 Drawing Sheets

OTHER PUBLICATIONS

F.F. Chen and R.W. Boswell, Helicons, the past decade, IEEE Trans. Plasma Sci. 25, 1245 (1997).

N. Benjamin, B. Chapman, and R. Boswell, Progress of an advanced diffusion source plasma reactor, in "Advanced Techniques for Integrated Circuit Processing", Proceedings of SPIE 1392, 95 (1990).

G.R. Tynan, A.D. Bailey III, G.A. Campbell, R. Charatan, A. de Chambrier, G. Gibson, D.J. Hemker, K. Jones, A. Kuthi, C. Lee, T. Shoji, and M. Wilcoxson, J. Vac. Sci. Technol. A 15, 2885 (1997).

D.G. Miljak and F.F. Chen, Helicon wave excitation with rotating antenna fields, Plasma Sources Sci. Technol. 7, 61 (1998).

L. Porte, S.M. Yun, F.F. Chen, and D. Arnush, Superiority of half-wavelength helicon antennas, Plasma Sources Sci. Technol. 12, 287 (2003).

F.F. Chen, X. Jiang, and J.D. Evans, Plasma injection with helicon sources, J. Vac. Sci. Technol. A 8, 2108 (2000).

F.F. Chen, The low-field density peak in helicon discharges, Phys. Plasmas 10, 2586 (2003).

F.F. Chen, X. Jiang, J.D. Evans, G. Tynan, and D. Arnush, Low Field Helicon Discharges, Plasma Phys. Control. Fusion 39, A411 (1997).

D. Arnush, Role of Trivelpiece-Gould Waves in Antenna Helicon Wave Coupling, Phys. Plasmas 7, 3042 (2000).

F. Heinrich, U. Bänziger, A. Jentzsch, G. Neumann, and C. Huth, Novel high-density plasma tool for large area flat panel display etching, J. Vac. Sci. Technol. B 14, 2000 (1996).

S.G. Park, C. Kim, and B.H. O, An array of inductively coupled plasma sources for large area plasma, Thin Solid Films 355, 252 (1999).

S.G. Park, B.H. O, M. Sohn, and J. Kim, Large area high density plasma source by helical resonator arrays, Surface and Coatings Technol. 133, 598 (2000).

F.F. Chen, J.D. Evans, and G.R. Tynan, Design and performance of distributed helicon sources, Plasma Sources Sci. Technol. 10, 236 (2001).

Y.J. Kim, S.H. Han, W.Hwang, and Y.S. Hwang, Development of a large-area, multi-helicon rectangular plasma source for TFT-LCD processing, Thin Solid Films 435, 270 (2003).

C. Watts, Alpha: A large-area plasma helicon array, Rev. Sci. Instrum. 75, 1975 (2004).

F.F. Chen and H. Torreblanca, Large-area helicon plasma source with permanent magnets, Plasma Phys. Control. Fusion 49, A81 (2007).

F.F. Chen and H. Torreblanca, Density jump in helicon discharges, Plasma Sources Sci. Technol. 16, 593 (2007).

http://spaceflight.nasa.gov/shuttle/support/researching/aspl/vasimr.html, printed Jan. 22, 2008.

F.F. Chen, Experiments on helicon plasma sources, J. Vac. Sci. Technol., A 10, 1389 (1992).

F.F. Chen and J.D. Evans, Performance of a multi-tube, large-area helicon source, Proc. Plasma Etch Users Group (NCCAVS, 150 W. Iowa Ave., Suite 104, Sunnyvale, CA 94086) (1998).

Sasaki, K., Kokubu, H., Hayashi, D., et al., Development of a compact nitrogen radical source by helicon-wave discharge employing a permanent magnet, Thin Solid Films 386, 243 (2001).

F.F. Chen, 2005 NSF Design, Service, and Manufacturing Grantees and Research Conference, Jan. 3-6, 2005, Scottsdale, AZ.

K.P. Shamrai and V.B. Taranov, Plasma Sources Sci. Technol. 5, 474 (1996).

D.D. Blackwell, T.G. Madziwa, D. Arnush and F.F. Chen, Phys. Rev. Lett. 88, 145002 (2002).

B. Lorenz, M Krämer, V.L. Selenin and Yu. M. Aliev, Plasma Sources Sci. Technol. 14, 623 (2005).

R.W. Boswell, Plasma Phys. Control. Fusion 26, 1147 (1984).

G.A. Campbell, D.I.C. Pearson and A.P. deChambrier, Proc. $33^{rd}$ Annual Techn. Conf., Society of Vacuum Coaters (1990).

K.P. Shamrai, Plasma Sources Sci. Technol. 7, 499 (1998).

M.A. Lieberman and A.J. Lichtenberg, Principles of Plasma Discharges and Materials Processing (Wiley, New York (1994), $2^{nd}$ ed.), p. 333.

V.F. Virko, G.S. Kirichenko, and K.P. Shamrai, Plasma Sources Sci. Technol. 11, 10 (2002).

K.P. Shamrai and V.B. Sharanov, Plasma Phys. Controlled Fusion 36, 1719 (1994).

V.A. Godyak, New ICP Technology for Semiconductor Material Processing, Presentation given at the Plasma Etch Users Group, Santa Clara, Sep. 2003.

B. Chapman, N. Benjamin, C.F.A. van Os, R.W. Boswell and A.J. Perry, $12^{th}$ Symposium on Dry Process, Denki-Gakkai, Tokyo (1991).

F.F. Chen and J.P. Chang, Principles of Plasma Processing (Kluwer/Plenum, New York, 2002), p. 71.

V.A. Godyak, New ICP Technology for Semiconductor Material Processing, Presentation given at the Plasma Etch Users Group, Santa Clara, Sep. 2003.

F.F. Chen and J.P. Chang, Principles of Plasma Processing (Kluwer/Plenum, New York, 2002), p. 61-74.

Written Opinion of the International Searching Authority dated Jun. 3, 2008 issued in PCT/US06/24565.

\* cited by examiner

TOP VIEW OF ONE MODULE

END VIEW

MATCHING CIRCUIT
TOP VIEW

END VIEW

HELICON PLASMA SOURCE WITH PERMANENT MAGNETS

This application is a continuation in part application that claims priority to PCT International Application number PCT/US2006/024565, which claims priority to U.S. provisional patent application No. 60/693,054 filed Jun. 23, 2005 and 60/801,051 filed May 18, 2006, and also claims priority to U.S. provisional application No. 60/924,382, the entire contents of all of which are incorporated herein by reference in their entirety.

This invention was made with government support under Grant No. DMI-0115570 awarded by the National Science Foundation. The government has certain rights in this invention.

BACKGROUND

1. Field of Invention

The present invention relates to a helicon plasma source, more particularly to a helicon plasma source having at least one permanent magnet, and to corresponding methods of plasma processing.

2. Discussion of Related Art

Helicon sources were invented around 1970 in Australia by R. W. Boswell[1]. Chen's group at UCLA demonstrated by careful measurements[2] that an earlier proposed Landau damping mechanism[3] was not the mechanism responsible for the extraordinary efficiency of the helicon sources in producing high plasma density. Early work on helicon waves and sources has been summarized in a book chapter[4] and in two review articles[5,6]. Commercial helicon reactors for etching of and deposition on semiconductor chips have been manufactured by Alcatel in France, Lucas Labs[7] in the San Francisco area, and PMT (now Trikon) in Chatsworth, Calif.[7A]

The injection of plasma from a single discharge tube, excited by a half helical antenna[8,9], into a large plenum was studied by Chen et al.[10] Surrounding the single discharge tube with a small solenoid was found to be inadequate, because the shape of the magnetic field was such that the particles in the plasma tended to impact the walls of the discharge tube, rather than traveling, that is, rather than being injected, into the plenum. This problem was resolved by replacing the solenoid with a large diameter electromagnet, which changed the shape of the magnetic field such that the magnetic field lines were substantially straight in passing from the discharge tube into the plenum. Because of the straight magnetic field lines, the particles in the plasma were injected into the plenum.

However, the use of a large electromagnet for generating an electromagnetic field with straight field lines for the injection of plasma from a discharge tube into a large plenum presents several problems for incorporation into a commercial helicon plasma source. A large electromagnet has a large electrical power requirement, and can require active cooling, for example, forced circulation of water or air. An electromagnet can be larger and heavier than a permanent magnet producing a magnetic field of similar magnitude and would be impractical for meter-size substrates. There thus remains a need for more comp act, extendable, and economical helicon plasma sources.

SUMMARY

It is therefore an object of the present invention to provide an improved helicon plasma source.

A helicon plasma source according to an embodiment of the invention has a discharge tube, a radio frequency antenna disposed proximate the discharge tube, and a permanent magnet positioned with respect to the discharge tube so that the discharge tube is in a far-field region of a magnetic field produced by the permanent magnet.

A helicon plasma source according to another embodiment of this invention has a vacuum chamber, a plurality of discharge tubes in fluid connection with an interior space of the vacuum chamber, a plurality of radio frequency antennas each disposed proximate a respective one of the plurality of discharge tubes; and a plurality of permanent magnets each arranged with respect to a respective one of the plurality of discharge tubes in respective far-field region of a magnetic field produced by said each permanent magnet.

A method of plasma processing according to an embodiment of the current invention includes placing a discharge tube in a far field region of a magnetic field produced by a permanent magnet, generating a plasma in the discharge tube by exposing a gas in the discharge tube to radio frequency radiation, and exposing an object being processed to the plasma.

BRIEF DESCRIPTION OF THE DRAWINGS

The detailed description that follows will make reference to the attached drawings, of which:

FIG. 24 shows the values of $C_1$ and $C_2$ in the standard configuration with $T_1$=44 in. and $T_2$=36 in.;

DETAILED DESCRIPTION

In describing embodiments of this invention, specific terminology is employed for the sake of clarity. However, the invention is not intended to be limited to the specific embodiments, examples or specific terminology so selected. A person skilled in the relevant art will recognize that other equivalent parts can be employed and other methods developed without departing from the spirit and scope of the invention. All references cited herein are incorporated by reference as if each had been individually incorporated.

The term helicon plasma source refers to a device which can provide plasma when it is operated. The term "source" does not imply that the plasma is necessarily present and/or that the device is being operated.

Helicon sources have many industrial uses because of their superior efficiency in generating dense plasmas. However, these sources require a dc magnetic field, which increases the cost and complexity compared with other radio frequency plasma generators. The use of permanent magnets (PMs) to produce the magnetic field, instead of heavy electromagnets which require a large power supply, has advantages. This does not work straightforwardly because the field lines of PMs curve back in such a way as to lead the plasma into the wall rather than to inject it into the process chamber. However, by creating the plasma in the weaker remote, reverse field of PMs, injection of plasma into a useful volume is permitted. Applications of helicon sources include but are not limited to space propulsion, flat-panel displays, large area substrates, flexible displays, focused ion sources, hydrogen fuel cell membranes, web coating, and the manufacture of solar cells, especially multi-layer solar cells.

Other applications in the flat-panel industry include dry etching for ITO and aluminum conductors because of the growing liquid waste problem. For large-area applications, distributed helicon sources are desirable.

Figure 1:
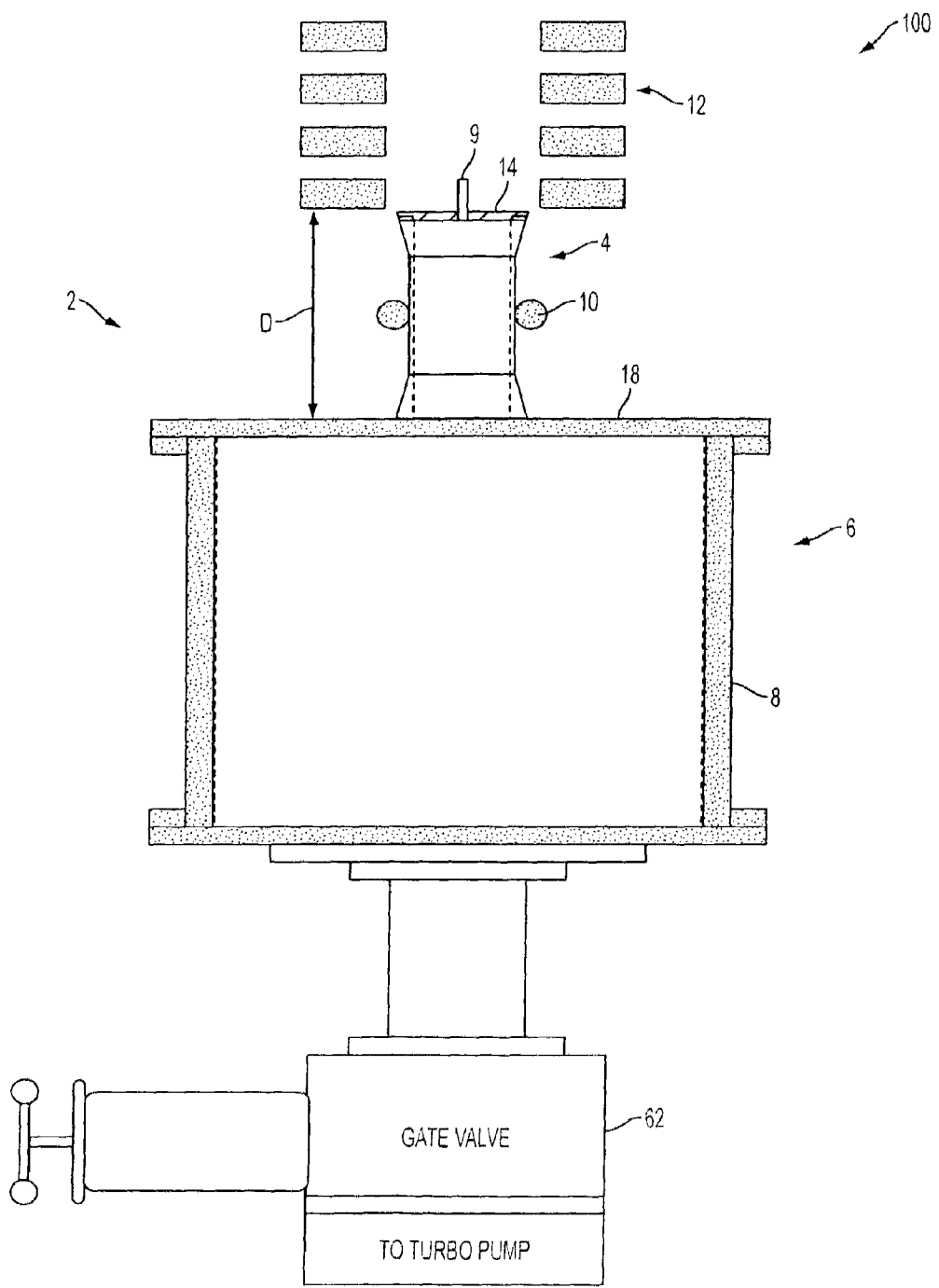
FIG. 1 is a cross-sectional schematic of a helicon plasma source according to an embodiment of the current invention.

An embodiment of a helicon plasma source 100 has a magnet array 12 illustrated schematically in FIG. 1. The magnet array 12 in this example is a permanent magnet array. This embodiment includes a vacuum chamber 2 with a plenum 6 and a discharge tube 4. The vacuum chamber 2 is bounded by walls 8 in this embodiment. The helicon plasma source 100 can include a gas feed port for fluidly coupling to a gas source. For example, the helicon plasma source 100 can include a showerhead gas feed within the plenum. The plenum 6 can be fluidly coupled to a vacuum system. For example, the plenum 6 can be fluidly coupled to a gate valve 62; the gate valve 62 can be fluidly coupled to a single or multistage pump system to pump gas from the vacuum chamber and thus provide a vacuum. Discharge tube 4 may have end plate 14. A radio frequency antenna 10 is located proximal to the discharge tube 4. Proximal can mean that the radio frequency antenna 10 is located such that radio frequency radiation emitted by the radio frequency antenna 10 affects the contents of the discharge tube 4, for example, affects a gas inside the discharge tube 4 by forming a plasma. The radio frequency antenna 10 can be located inside of the discharge tube 4 or outside of the discharge tube 4. For example, the radio frequency antenna 10 can surround the discharge tube 4. The radio frequency antenna 10 can be a circular winding of m=0 symmetry, as illustrated in FIG. 1. Good results have been obtained with radio frequency antenna 10 having three circular windings arranged beyond the mid-point of the discharge tube 4 towards the vacuum chamber 2. In particular, good results have been obtained using three circular wings of hollow copper tubing wrapped tightly around the discharge tube 4 close to the exit aperture of the discharge tube in which the radio frequency antenna 10 is cooled by causing a fluid to flow through the radio frequency antenna 10 to carry away heat. The discharge tube 4 may also be provided with a flange, or "skirt," that provides an insulation layer of material that may be of the same material and integral with the discharge tube 4 between the radio frequency antenna 10 and the top surface of the vacuum chamber 2. This permits the radio frequency antenna 10 to be placed close to the exit aperture of the discharge tube 4 without inducing image currents that can adversely affect the operation of the helicon plasma source 100. This arrangement was found to be suitable to provide a compact helicon plasma source 100. However, broad concepts of this invention are not limited to only such an antenna design. Other types and configurations of radio frequency antennas may be used without departing from general concepts of this invention. In operation, radio frequency radiation emitted by the radio frequency antenna 10 excites a gas in the discharge tube 4 to produce a plasma. The magnet array 12 can be positioned with respect to the discharge tube 4 so that plasma generated in the discharge tube 4 is injected into the plenum 6. The magnet array 12 can be positioned with respect to the discharge tube 4 so that plasma generated in the discharge tube 4 is injected into the plenum 6 and onto a substrate (not shown in FIG. 1) within the plenum 6.

The embodiment illustrated schematically in FIG. 1 has a magnet array 12 of a plurality of permanent magnets. However, a single permanent magnet can be used instead of a magnet array. For example, a single permanent magnet in a ring shape has been found to be suitable for some specific applications of an embodiment of this invention. In addition, the array is not limited to being four magnets in the array. The array may be two, three, or more than four permanent magnets without departing from the scope of this invention. The permanent magnets may be made from available materials selected according to the specific application. For example, ceramic magnets, Neodymium Iron Boron (NdFeB), Samarium Cobalt or Alnico are currently available materials that may be used in particular embodiments of this invention. Good results have been obtained with NdFeB permanent magnets in a particular embodiment. However, the broad concepts of this invention are not limited to permanent magnets made from particular materials.

In an embodiment, the helicon plasma source includes a mechanism for adjusting the position of the magnet array 12, with respect to the discharge tube 4. For example, one may provide an iron plate to which the permanent magnets may be attached by means of the magnets' own magnetic fields. In particular embodiments of this invention, the magnets are so strong that they will remain stuck to the iron plate even when attached on the underside of the iron plate. One may provide a shallow recess in the metal plate to aid in attaching the magnets to the proper position or positions. The iron plate can then be arranged farther away from the discharge tube 4 compared to the corresponding attached magnet and serve as a return path of magnetic field lines on the side of the permanent magnets directed away from the discharge tube. The iron plate can then be attached to a mechanical structure that can be used to adjust its distance D relative to the discharge tube. The general concepts of this invention are not limited to specific mechanical structures for adjusting the distance D. The structure may be manually operable, motorized or could be operated by control systems, feedback systems, an automated system or other suitable mechanical or electromechanical systems without departing from the general concepts of this invention. Such a system allows for adjustment of the position of the magnet array 12 to adjust distance D and thereby to optimize the performance of the helicon plasma source, for example, to maximize the plasma density. The distance D may be in the range of, for example, from about 4 (four) inches to about 15 inches.

The length of the discharge tube, material of the end plate, frequency of the radio frequency radiation emitted from the radio frequency antenna 10, position of the radio frequency antenna 10, type of the radio frequency antenna 10, and position of the magnet array 12, with respect to the discharge tube can be adjusted so that the radio frequency radiation emitted by the antenna 10 and reflected by the end plate 14 of the discharge tube 4 interfere constructively. Depending on the material of the endplate, the radio frequency radiation may undergo a phase shift upon reflection from the end plate or have essentially no phase shift. Metal endplates were found to work well for obtaining compact configurations; however, general concepts of this invention are not limited to the use of only metal endplates. This constructive interference can result in an increase of plasma density; the plasma density can peak at a low magnitude of the magnetic field[11].

Suitable materials for the discharge tube include, but are not limited to, Pyrex, alumina or quartz. A height of about 5 cm, an inner diameter of about 5.1 cm, and an outer diameter to the outer edges of the "skirts" of about 10 cm for the discharge tube 4 were found to be suitable in an embodiment of this invention. This invention includes, but is not limited to such dimensions and arrangements.

The helicon plasma source can include an additional magnetic field source for shaping the magnetic field produced by the magnet array 12. The magnetic field can be shaped, for example, to minimize the fraction of ions generated in the discharge tube 4 which impinge on the walls 8 bounding the discharge tube 4 or on the walls 8 bounding the plenum 6 in the vicinity of the discharge tube 4. The additional magnetic field source can include a secondary permanent magnet, an auxiliary electromagnetic coil, and/or an auxiliary electromagnet.

The radio frequency antenna 10 can be coupled to a radio frequency power supply. The radio frequency power supply can be matched to the impedance of the radio frequency antenna 10 and plasma in the discharge tube 4. The radio frequency power supply can be selected or adjusted to generate radio frequency radiation of frequency greater than about, for example, 2 megahertz or greater than about, for example, 10 megahertz. For example, the radio frequency radiation generated can be about 13 megahertz, for example, 13.56 megahertz. The radio frequency radiation generated can be about 27 megahertz, for example, 27.12 megahertz. The radio frequency radiation generated can be above 27 megahertz, for example, 60 megahertz.

Figure 2:
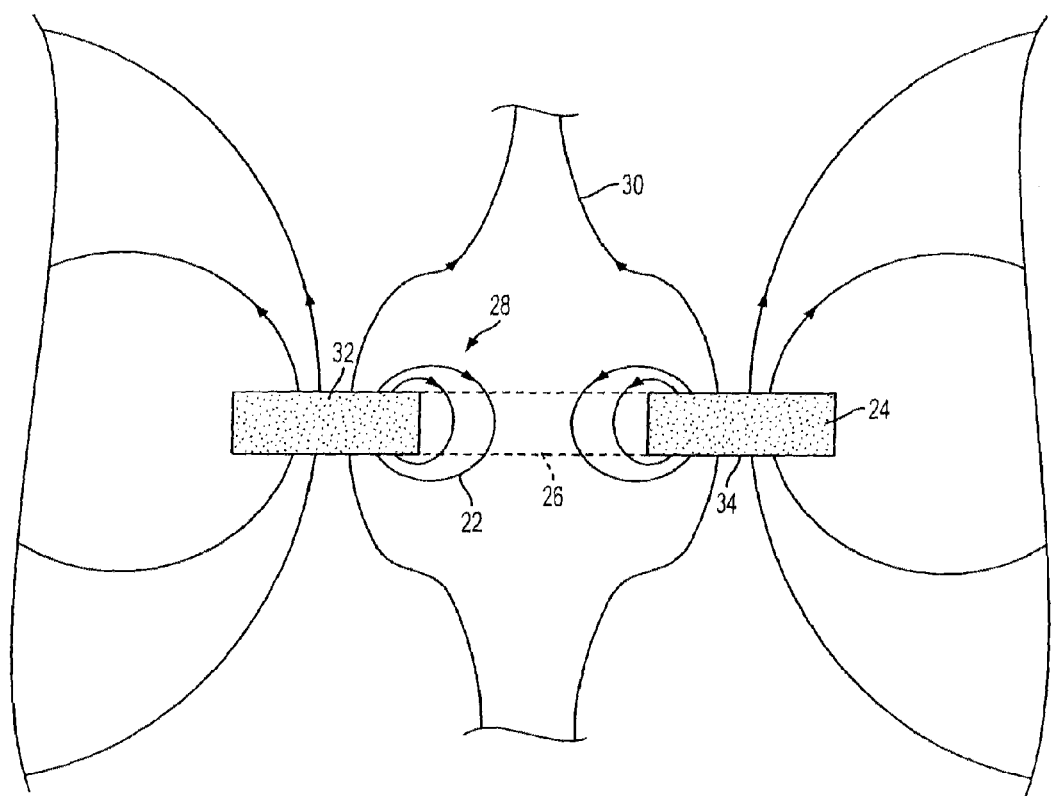
FIG. 2 is a cross-sectional illustration of the magnetic field around a ring-shaped permanent magnet.

FIG. 2 illustrates magnetic field lines in the vicinity of a ring-shaped permanent magnet. The ring-shaped magnet 24 has a north pole 32, on the upper side of the ring-shaped magnet 24; and the ring-shaped magnet 24 has a south pole 34, on the lower side of the ring-shaped magnet 24. The near-field magnetic field vectors, within and close to the hole 26 of the ring-shaped magnet 24, represented by the tangent to the near-field magnetic field lines 22 in the direction of the arrows 28, are oriented downward. The region in the vicinity of the hole 26 where the magnetic field vectors are oriented downward is termed the near-field region. By contrast, at some distance above or below the hole 26, the magnetic field vectors are oriented upwards, as shown by the far-field magnetic field line 30. The region where the magnetic field vectors are oriented upward, even close to the axis running through the hole 26, can be termed the far-field region. In addition, there is a null in the magnetic field in a region between the near-field and far-field regions which can also be useful to distinguish between the two regions. In an embodiment of this invention, a ring-shaped magnet made from NdFeB having an outer diameter of about 5 inches, an inner diameter of about 3 inches and a thickness of about 1 inch was found to be suitable to be used as a single magnet without the need for a magnet stack. Such a magnet produced about $B_r$=12.3 Tesla.

Figure 3:
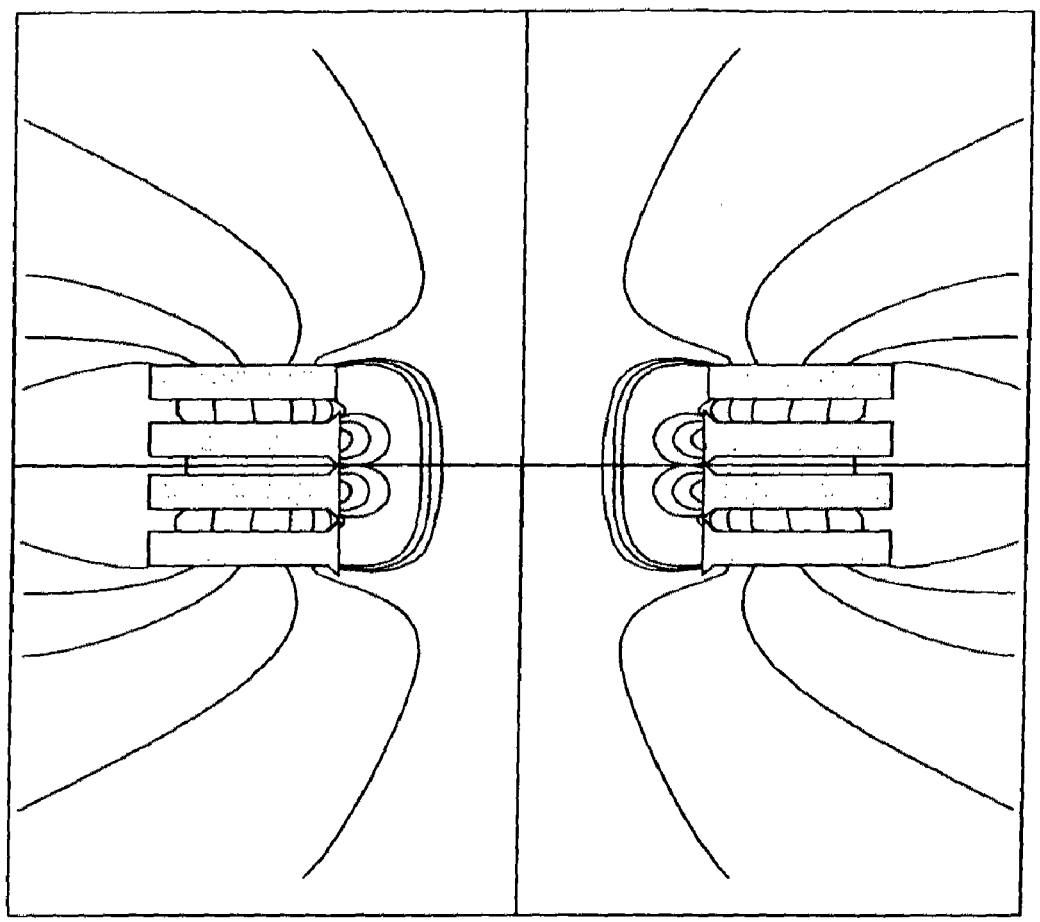
FIG. 3 is a cross-sectional illustration of the magnetic field around a permanent magnet array.
Figure 4:
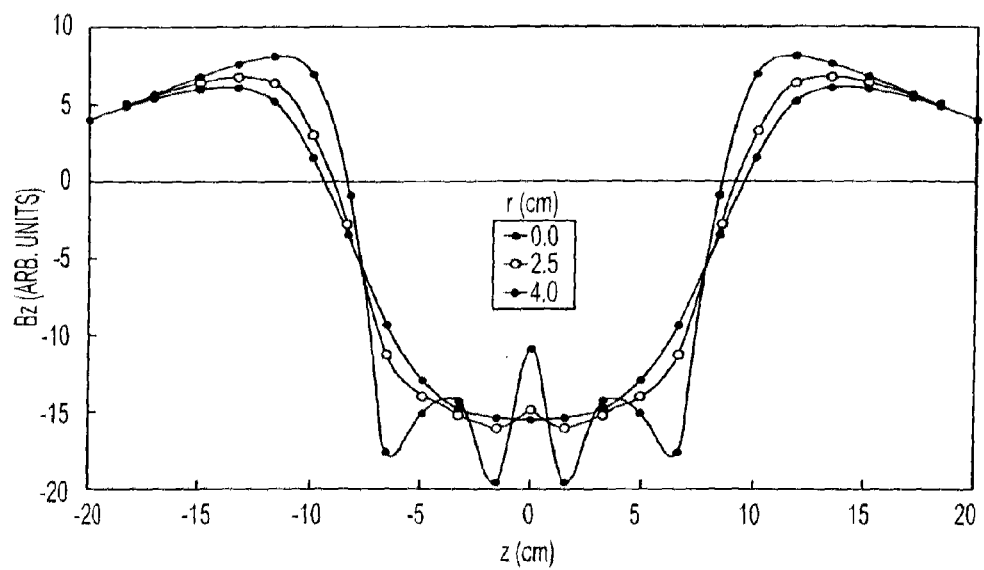
FIG. 4 is a graph of the magnitude of the magnetic field in the axial direction as a function of axial position.

When multiple ring-shaped magnets 24 are stacked into a magnet array 12 with space between the ring-shaped magnets 24, and with the magnetic poles of the ring-shaped magnets 24 oriented in the same or a similar direction, the magnetic field can resemble that of the computed magnetic field lines presented in FIG. 3. FIG. 4 presents a graph of the magnitude of the magnetic field in a direction parallel to the axis running through the hole 26 as a function of axial distance for several different radial distances from the axis running through the hole 26. The axial distance is the distance from the midplane perpendicular to the axis running through the hole 26 which intersects the center of the magnet array 12. For example, along the axis (r=0 cm), the magnitude of the magnetic field is negative, i.e., the magnetic field vector has a downward orientation, in the near-field region, between axial positions of about −8 cm and +8 cm. The magnitude of the magnetic field is positive, i.e., the magnetic field vector has an upward orientation, in the far-field region, at axial positions greater than about +8 cm and less than about −8 cm. The graphs of the magnitude of the magnetic field at radial distances of 2.5 cm and 4 cm from the axis are similar, except that the graph of the magnitude of the magnetic field at a radial position of 4 cm shows oscillations in the near-field region which reflect the spacing of the ring-shaped magnets 24.

Figure 5:
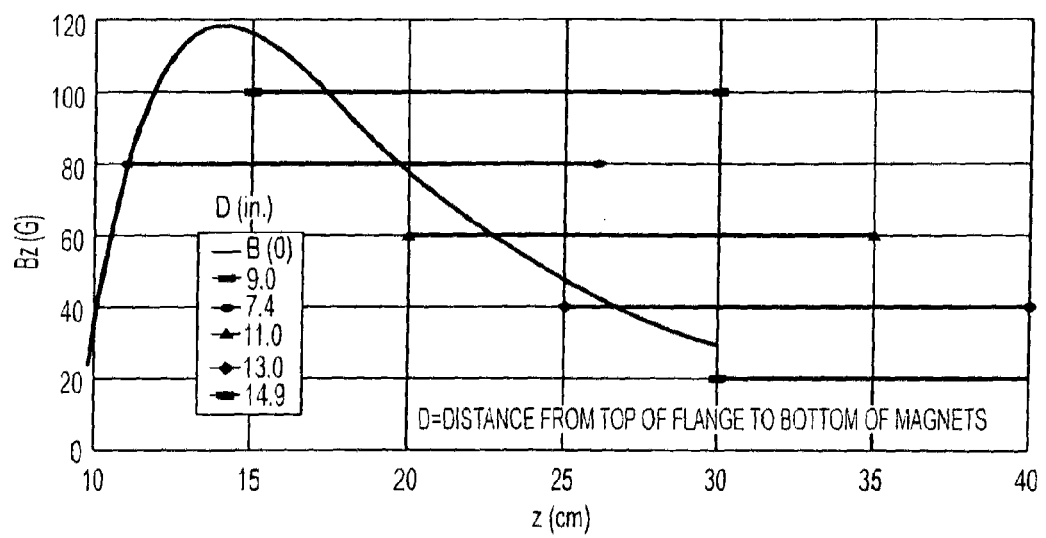
FIG. 5 is a graph of the magnitude of the magnetic field in the axial direction as a function of axial position.

The magnet array 12 can be positioned with respect to the discharge tube 4, so that the discharge tube 4 is in the far-field region of the magnet array 12. FIG. 5 presents the computed magnitude of the magnetic field in a direction parallel to the axis running through the holes 26 of ring-shaped magnets 24 in a magnet array 12 as a function of axial distance in the far-field region. The axial distance is with respect to the midplane of the magnet array 12. The horizontal bar towards the top of the graph represents the axial extent of the discharge tube 4, and corresponds approximately to the configuration shown in FIG. 1. Thus, the discharge tube 4 in FIG. 1 is within the far-field region of the magnetic field produced by the magnet array. Electrons and ionized particles in the plasma tend to travel along magnetic field lines. It is thought that because the magnetic field vectors are oriented primarily in a direction parallel to the axis running through the discharge tube 4, electrons and ions produced in the discharge tube 4 will primarily travel toward the end plate 14 of the discharge tube 4 or into the plenum 6, rather than impact the walls of the discharge tube 4. Thus, locating the discharge tube in the far-field region can promote injection of the plasma into the plenum 6.

Figure 6:
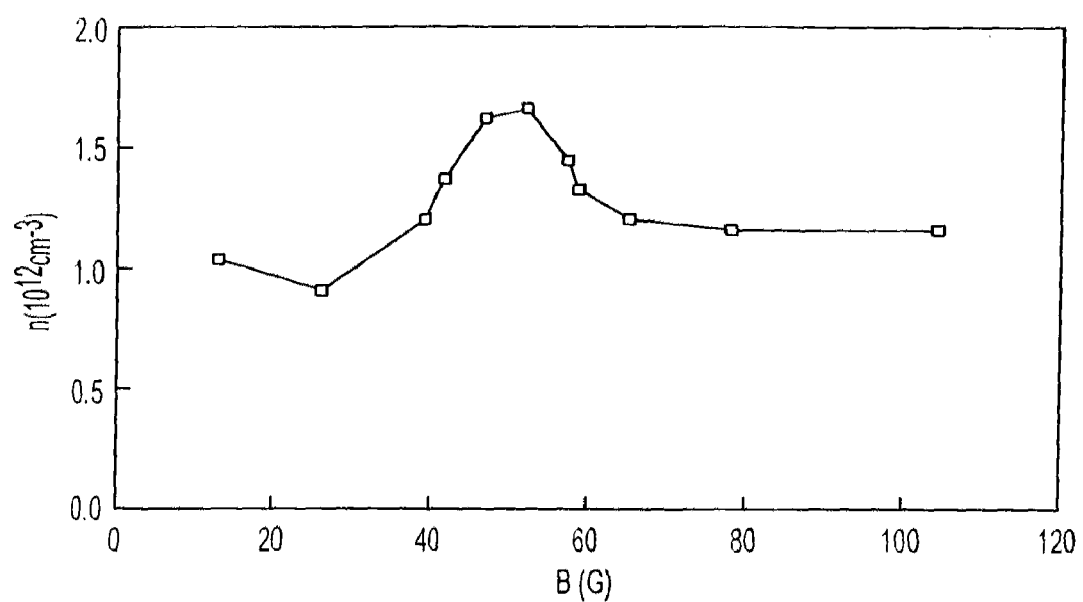
FIG. 6 is a graph of plasma density as a function of magnitude of the magnetic field.

FIG. 6 presents data points from a set of experiments on a graph of plasma density as a function of magnetic field magnitude[12]. A maximum in a peak in plasma density is apparent at a low magnetic field magnitude of about 50 gauss. The peak extends between about 40 gauss and about 60 gauss. The magnetic field magnitude at which this peak is observed can depend on factors such as the length of the discharge tube, material of the end plate, the frequency of the radio frequency radiation emitted from the radio frequency antenna 10, the position of the radio frequency antenna 10, the type of the radio frequency antenna 10, the position of the magnet array 12, and the plasma density. The maximum peak has been experimentally observed within magnetic field magnitudes ranging from about 10 to about 100 gauss. Computational simulations using the HELIC computer code have shown that the peak can occur at a magnitude of magnetic field as great as 1000 gauss for a high plasma density.

Figure 7:
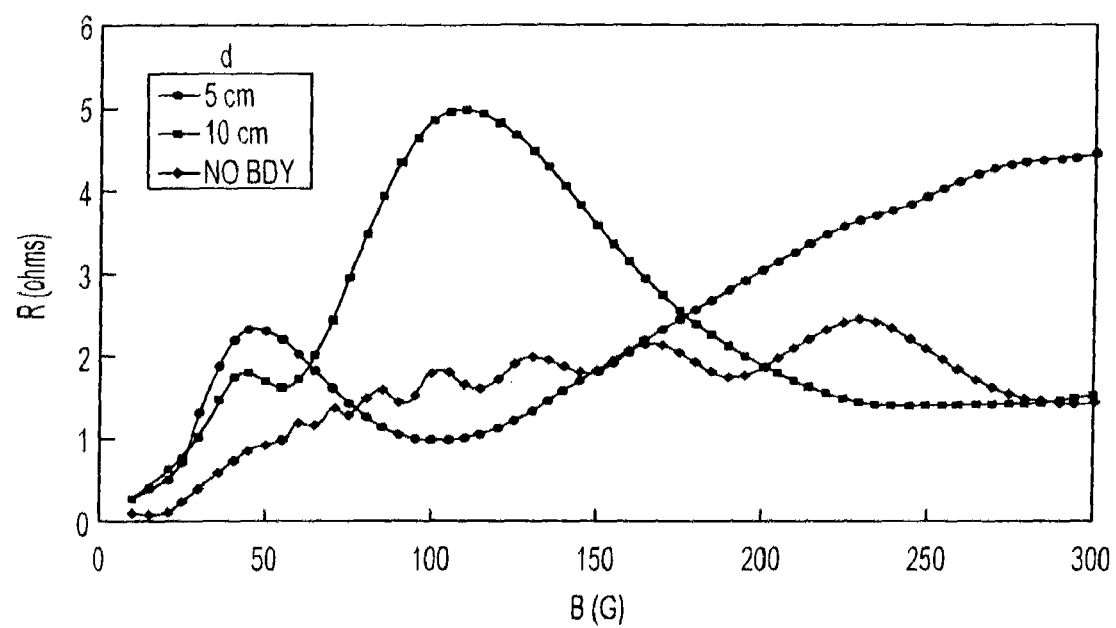
FIG. 7 is a graph of computed plasma resistance as a function of magnitude of the magnetic field.
Figure 8:
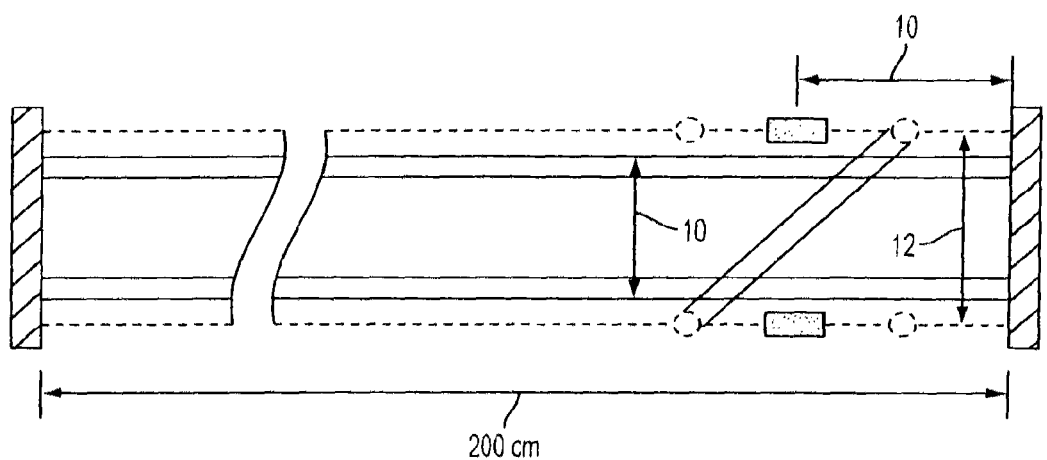
FIG. 8 is an illustration of a geometry used in computing plasma resistance as a function of the magnetic field.

FIG. 7 is the result of a computational simulation using the HELIC computer code 1 and based on the geometry of a discharge tube 4 and helical radio frequency antenna shown in FIG. 8. FIG. 7 shows the variation in plasma loading, that is, plasma resistance, as a function of the magnitude of the magnetic field; the peak in resistance for a curve corresponds to a peak in plasma density when the plasma resistance is not large compared with parasitic resistances in the radio frequency circuitry. The different curves represent measurements obtained with different simulated distances of the helical radio frequency antenna from an end of a discharge tube 4. "No bdy" in the legend means "no boundary", that is, no endplate such that the plasma extends infinitely in the direction which an endplate would ordinarily bound, and there are no reflections. If the magnetic field or the supplied radio frequency power is large, then the plasma resistance can be much larger than the parasitic resistances. The peak in density can then disappear, although there is a peak in the plasma resistance.

In another embodiment, a multiple discharge tube helicon plasma source can include a vacuum chamber with a plurality of discharge tubes and a plenum. The vacuum chamber can be bounded by walls. A radio frequency antenna can be located proximal to each discharge tube. The multiple discharge tube helicon plasma source can include a plurality of magnet arrays positioned with respect to the discharge tubes, so that plasma generated in each discharge tube is injected into the plenum. The plurality of magnet arrays can be positioned with respect to the discharge tubes, so that plasma generated in each discharge tube is injected into the plenum and onto a substrate within the plenum. Such a multiple discharge tube helicon plasma source can be used to treat a large object or to treat a substrate of large surface area.

Figure 9:
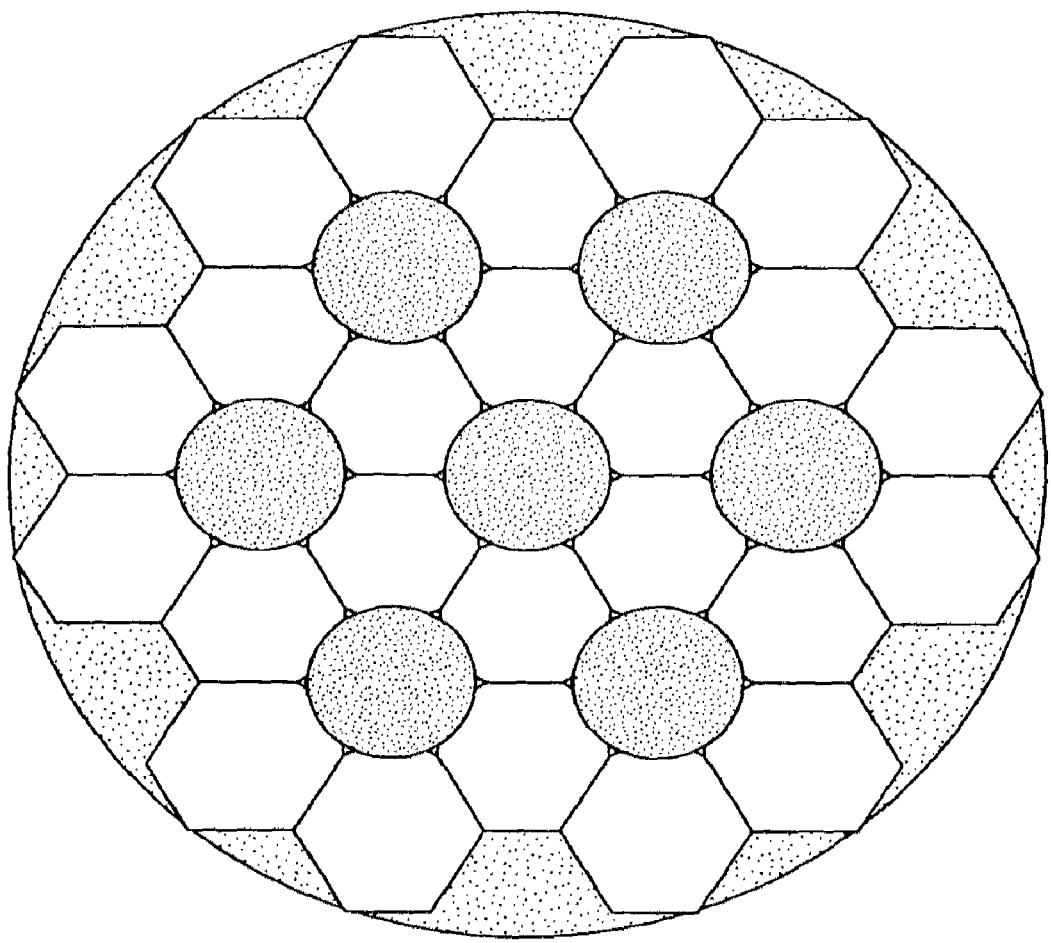
FIG. 9 is a top view schematic of discharge tubes and the top flange of the plenum.

The discharge tubes of the multiple discharge tube helicon plasma source can be, for example, arranged as a linear, rectangular, or circular array. The array can be selected based on the shape of the object or substrate surface to be treated. For example, FIG. 9 shows a top schematic view of a multiple discharge tube helicon plasma source, with the discharge tubes represented by the dark circle; the plenum of the multiple discharge tube helicon plasma source can have the form of a cylinder. The hexagonal arrangement of the discharge tubes can be used to treat, for example, an object or substrate having a substantially circular form. A circular arrangement of the discharge tubes with more than 6 discharge tubes in the circle, or an arrangement of discharge tubes in a set of concentric circles can similarly be used in the treatment of an object or substrate having a substantially circular form. Other arrangements of the discharge tubes can be used.

A helicon plasma source used in flat panel display production can treat a substrate area of 1 meter by 2 meters. Such an area can be covered by, for example, an array of 5 by 10 discharge tubes, that is, by 50 tubes. The number of discharge tubes used can depend, for example, on the area to be treated, the uniformity of treatment of a substrate required, the size of each discharge tube, and the distance between the discharge tube and the substrate, a greater distance leaving more space for the plasma distribution to become more uniform between exiting the discharge tubes and impinging on the substrate. A helicon plasma source used to treat a substrate on, for example, a belt which passes into and out of the helicon plasma source can include, for example, an array of 6 discharge tubes in a line. The number of discharge tubes used can depend, for example, on the width of substrate to be treated, the uniformity of treatment of a substrate required, the size of each discharge tube, and the distance between the discharge tube and the substrate, a greater distance leaving more space for the plasma distribution to become more uniform between exiting the discharge tubes and impinging on the substrate.

In a multiple discharge tube helicon plasma source, each discharge tube can be separated from another discharge tube by a space; such separation of discharge tubes is illustrated in FIG. 9. The separation of the discharge tubes can be adjusted to optimize the uniformity of plasma density on the surface of an object or substrate in the plenum. Alternatively, the discharge tubes can be closely packed in a multiple discharge tube helicon plasma source. The size of the discharge tubes may be, for example, in the range of from about 2 inches to about 12 inches in diameter, for example, in the range of from about 2 inches to about 4 inches in diameter. The spacing between the discharge tubes may be, for example, in the range of from about 6 inches to about 12 inches from the center of a discharge tube to the center of a neighboring discharge tube.

A magnet array for a discharge tube can have its magnets at a different height than the magnet array for a neighboring discharge tube. This can allow for spacing of discharge tubes at smaller distances from each other than if the magnets for all arrays were at the same height. That is, if a magnet array for a discharge tube has its magnets at a different height than the magnet array for neighboring discharge tubes, the magnets can overlap to allow for the discharge tubes to be close to each other.

The multiple discharge tube helicon plasma source can include a radio frequency power supply and a distribution and impedance matching circuit. The distribution and impedance matching circuit can couple the radio frequency antennas of an array of discharge tubes to the radio frequency power supply. The impedance matching circuit can match the total impedance of the array of radio frequency antennas with discharge tubes to the radio frequency power supply.

Alternatively, the multiple discharge tube helicon plasma source can include a plurality of radio frequency power supplies. Each discharge tube can have a radio frequency power supply. The radio frequency power supply can be coupled to a single discharge tube. The radio frequency power supply can be matched to the impedance of the radio frequency antenna of the plasma in the single discharge tube with which the radio frequency power supply is coupled. The power supplied by a radio frequency power supply can be controlled independently of the power supplied by any other radio frequency power supply. The multiple discharge tube helicon plasma source can include a controller, with the controller having a set point input and control outputs. A control output can be coupled to a radio frequency power supply. The multiple discharge tube helicon plasma source can include a plurality of plasma density probes and/or a moveable plasma density probe within the vacuum chamber. Each plasma density probe and/or moveable plasma density probe can have a probe output line coupled to the controller.

A method according to an embodiment of this invention includes placing a discharge tube in the far field region of a magnetic field of a permanent magnet. The permanent magnet can be a single magnet or an array of permanent magnets stacked together. A plasma can be generated in the discharge tube by exposing a gas in the discharge tube to radio frequency radiation. The gas can be, for example, argon, chlorine, fluorine, oxygen, sulfur hexafluoride, or any other suitable gas or any suitable mixture of gases. A substrate or other object can be exposed to the plasma. For example, the discharge tube can be fluidly coupled to a plenum and the substrate or object can be placed in the plenum, so that plasma is injected from the discharge tube into the plenum and onto the substrate or object. The substrate can be a substrate of large area, and the object can be a large object.

The plasma density can be maximized at a low magnitude magnetic field by adjusting the length of the discharge tube, changing the material of the end plate, adjusting the frequency of the radio frequency radiation, adjusting the pattern of the radio frequency radiation, adjusting the position of the discharge tube within the magnetic field, and/or adjusting the magnitude of the magnetic field. The plasma density can be maximized by shaping the magnetic field by adjusting the position and/or magnitude of a secondary permanent magnet, an auxiliary electromagnetic coil, and/or an auxiliary electromagnet. The magnetic field can be shaped to form the plasma into a beam. A uniform plasma density can be achieved by shaping the magnetic field by adjusting the position and/or magnitude of a secondary permanent magnet, an auxiliary electromagnetic coil, and/or an auxiliary electromagnet. A greater efficiency of plasma injection, that is, a greater fraction of plasma generated in the discharge tube can impinge on a substrate instead of on walls by shaping the magnetic field by adjusting the position and/or magnitude of a secondary permanent magnet, an auxiliary electromagnetic coil, and/or an auxiliary electromagnet.

The pressure in the vacuum chamber may be in the range of, for example, from about 0.5 to 30 mTorr. The plenum may have, but is not limited to, a cylindrical shape. For example, the plenum may be 1 meter in diameter and 1 meter long. The plenum may have a greater or a lesser size, the size of the plenum can be determined by the application.

The magnets may, for example, have a ring shape. The radio frequency emitted by an antenna associated with a discharge tube may, for example, have a frequency of greater than 0.5 megahertz, for example, a frequency of about 2 megahertz, a frequency of greater than 5 megahertz, for example, a frequency of about 6.78 megahertz, a frequency of greater than 10 megahertz, for example, a frequency of about 13.56 megahertz or, for example, a frequency of about 27.12 megahertz, a frequency of greater than 30 megahertz, for example, a frequency of about 60 megahertz. The power of radio frequency radiation emitted by an antenna associated with a discharge tube may be, for example, from about 40 watts to about 1000 watts.

HELIC computations have shown that the antenna coupling efficiency can be better at frequencies other than 2 MHz, depending on the density. For higher densities, the power supply and matching circuit can be converted, for instance, to 6.78, 13.56, and 27.12 MHz. The antenna coupling efficiency can be greater for larger diameter tubes, if the power supply can be impedance matched to the inductance of the antenna. The tube diameter and length can be optimized. The power supply and matching circuit can be converted to 6.78 MHz, 13.56 MHz, or, if possible, to 27.12 MHz. A linear multitube source with optimized tube spacing can be built and tested. A small radio frequency (rf) power supply suitable for individual powering of the tubes in an array can be built and tested. Such a supply would not require a matching circuit. The control of individual power supplies to improve plasma uniformity, and also feedback control can be provided in embodiments of this invention. A large rectangular multitube source suitable for processing of flat panel displays can also be provided according to an embodiment of this invention.

Embodiments of this invention include a helicon source having a vacuum chamber, an m=0 radio frequency antenna, a gas feed, and permanent magnets, suitable for generating a plasma and injecting it into a large plenum and onto a substrate. The apparatus operates in the remote, reverse field of the permanent magnets, and can incorporate a mechanism for adjusting the position of the magnets. An apparatus may be adjusted to utilize the low-field peak effect of helicon discharges, in which reflections from the tube endplates enhance the wave intensity. An apparatus may incorporate other ferromagnetic elements for shaping the magnetic field, such as a ferromagnetic plate attached to the magnets, and auxiliary electromagnetic coils for field shaping.

Another embodiment of this invention is a multitube, distributed helicon plasma source comprising a plurality of discharge tubes together with a distribution and matching circuit to couple to the rf power supply. The individual discharge tubes may be in a linear, rectangular, or circular array, for example, or in other arrangements according to the particular application. For example, there may be a rectangular configuration of discharge tubes arranged in rows and columns. A separation distance between adjacent discharge tubes along a row of about 7 inches as measured from the centers of the discharge tubes and 7 inches along a column may be suitable for some applications for 5.1 cm inner diameter discharge tubes; however the general concepts of this invention are not limited to only those separations. One could also energize selected discharge tubes within a large array while leaving others non-energized to obtain selectable patterns of energized discharge tubes over a wide area. This can provide additional control and flexibility over a helicon plasma source having a large array of discharge tubes without having to specifically construct a particular array pattern for each application. The gas can be fed individually to each tube through its top cover, or the gas feed, or additional gas feeds, can be in the plenum downstream from the source. There can be a small, individual rf power supply for each tube, matched directly to the impedance of the antenna and plasma, optionally with individual control of each power supply for plasma uniformity. Alternatively, there can be a single power supply that is impedance matched to more than one discharge tube and RF antenna to provide substantially equal rf power to each discharge tube.

Further embodiments are discussed in the Examples below.

EXAMPLE 1

Figure 10A:
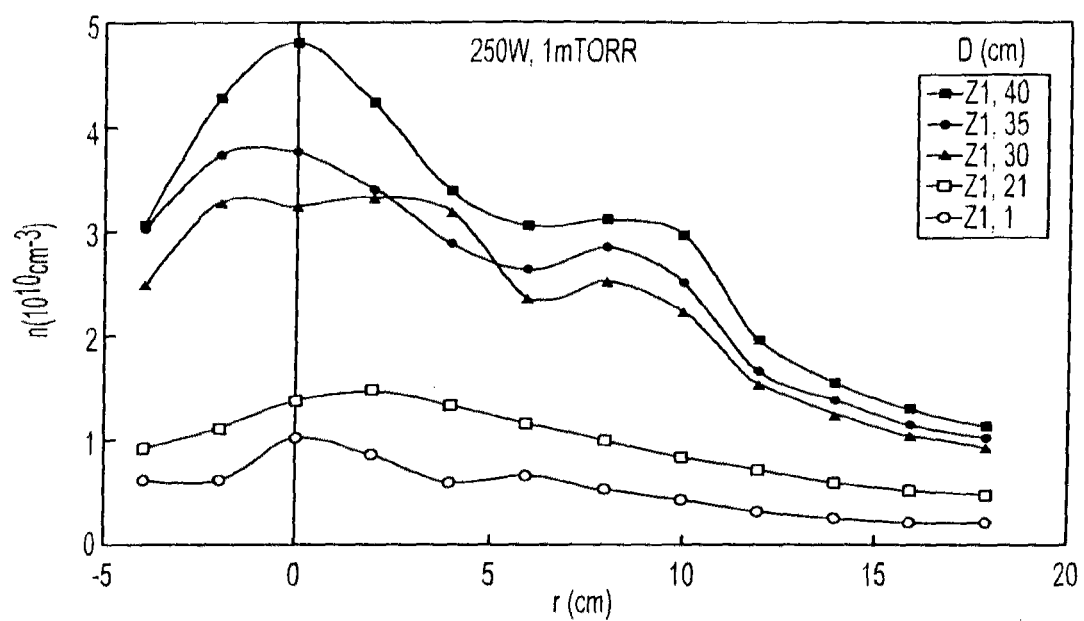
FIG. 10a is a graph of plasma density as a function of radial position.
Figure 10B:
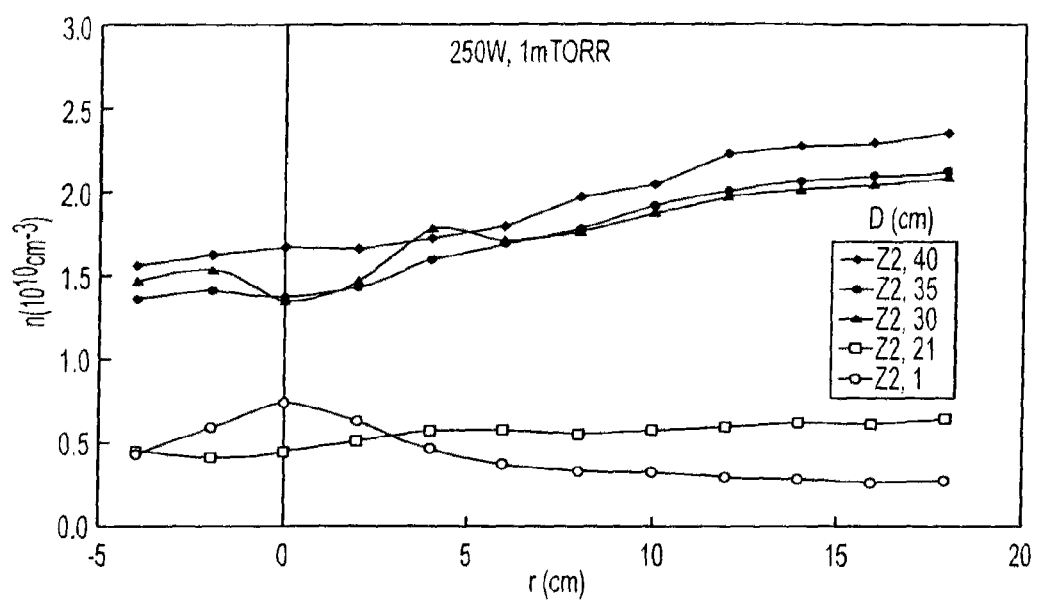
FIG. 10b is a graph of plasma density as a function of radial position.

The helicon plasma source illustrated in FIG. 1 was used in a set of experiments. The circular m=0 symmetry radio frequency antenna 10 was positioned about the middle axial position of the discharge tube 4. The radio frequency antenna 10 was connected to a 2 megahertz radio frequency power supply through an impedance matching circuit. The end plate 14 of the discharge tube was formed of PYREX glass. FIGS. 10a, 10b, 11a, and 11b present the plasma density as a function of radial position with respect to the axis running through the permanent magnet array 12, the discharge tube 4, and the plenum 6. FIGS. 10a and 10b present the results of experiments performed under conditions of 250 W radio frequency power and 1 mTorr gas pressure in the vacuum chamber 2. FIG. 10a presents the data obtained at an axial position of 7.5 cm (axial position Z1) below the top of the top flange 18 bounding the plenum 6. The different curves represent data obtained for different distances D between the top of the top flange 18 and the bottom of the permanent magnet array 12. Thus, the data for the curve for which D=1 cm was obtained with the permanent magnet array nearly entirely surrounding the discharge tube 4. Thus, these data were obtained with the discharge tube 4 in the near field region of the magnetic field; the plasma density was low. For successively higher D values, corresponding to successively greater distances between the top flange 18 and the bottom of the permanent magnet array 12, the plasma density increases. The density profiles are not uniform with respect to radial position because of the rather short distance between the point where a measurement was taken and the top flange 18, where the plasma enters the plenum 6 from the discharge tube 4.

FIG. 10b presents the data obtained at an axial position of 17.5 cm (axial position Z2) below the top of the top flange 18 bounding the plenum 6. Again, the data for the curve for which D=1 cm was obtained with the permanent magnet array nearly entirely surrounding the discharge tube 4; the discharge tube 4 was in the near field region of the magnetic field, and the plasma density was low. For successively higher D values, corresponding to successively greater distances between the top flange 18 and the bottom of the permanent magnet array 12, the plasma density increases. The density profiles are more uniform than those shown in FIG. 10a, because of the greater distance between the point where a measurement was taken and the top flange 18.

Figure 11A:
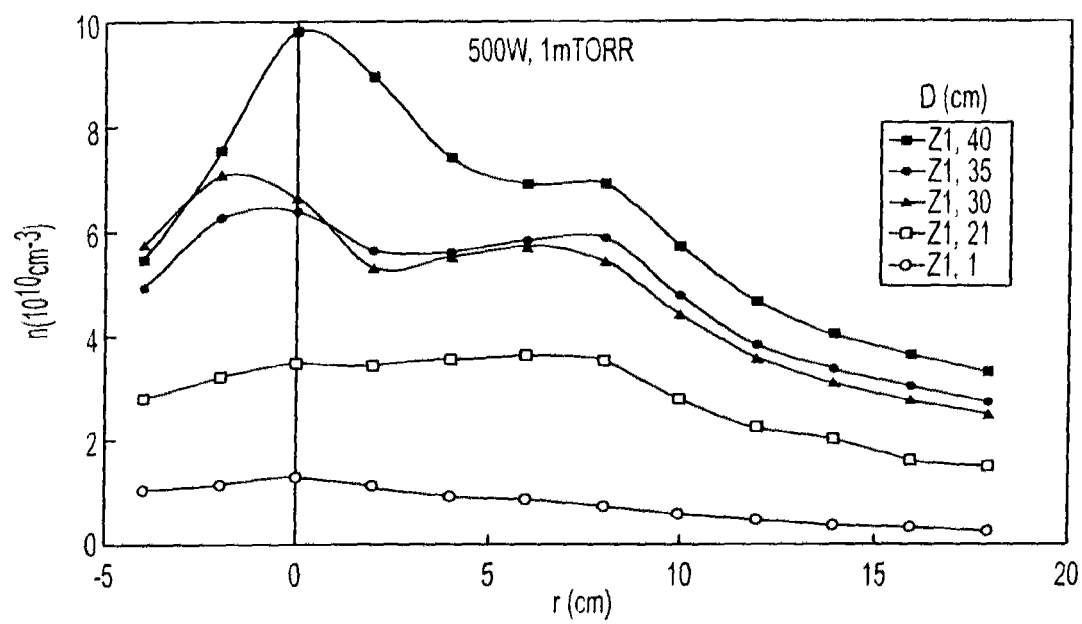
FIG. 11a is a graph of plasma density as a function of radial position.
Figure 11B:
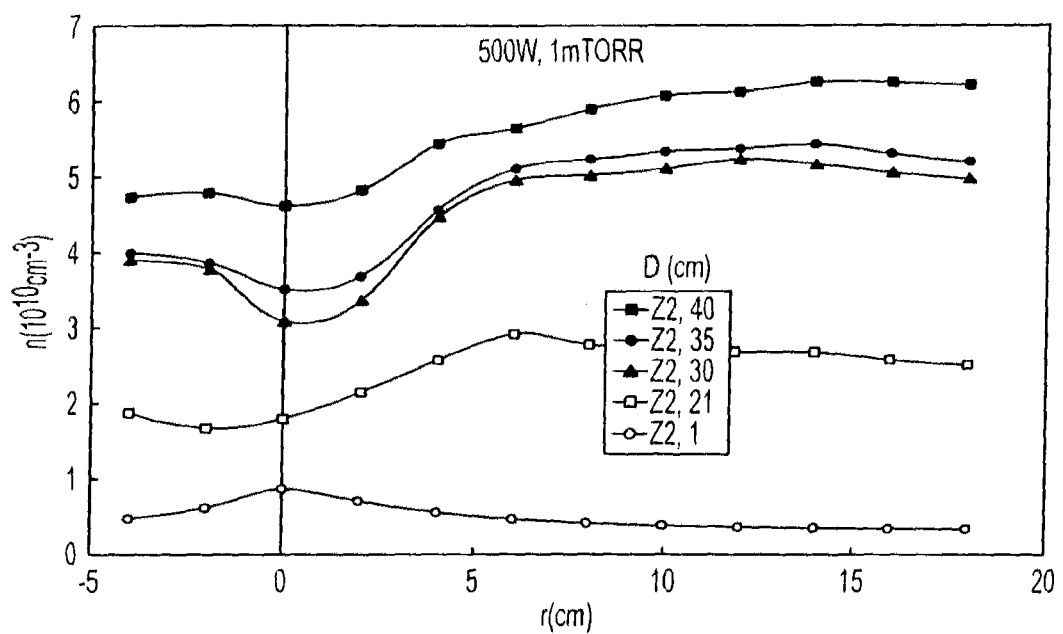
FIG. 11b is a graph of plasma density as a function of radial position.

FIG. 11a presents experimental data taken under the same conditions and at the same axial position as the data presented in FIG. 10a, except that the radio frequency power is 500 W. The experimental results are similar to those presented in FIG. 10a. FIG. 11b presents experimental data taken under the same conditions and at the same axial position as the data presented in FIG. 10b, except that the radio frequency power is 500 W. The experimental results are similar to those presented in FIG. 11b.

EXAMPLE 2

Figure 12:
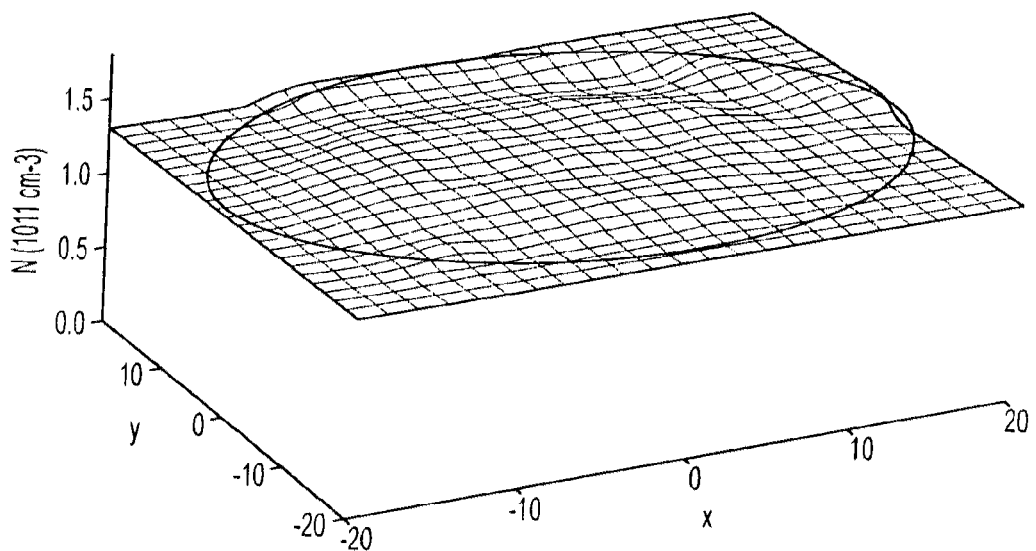
FIG. 12 is a 3-dimensional plot of plasma density as a function of position.
Figure 13:
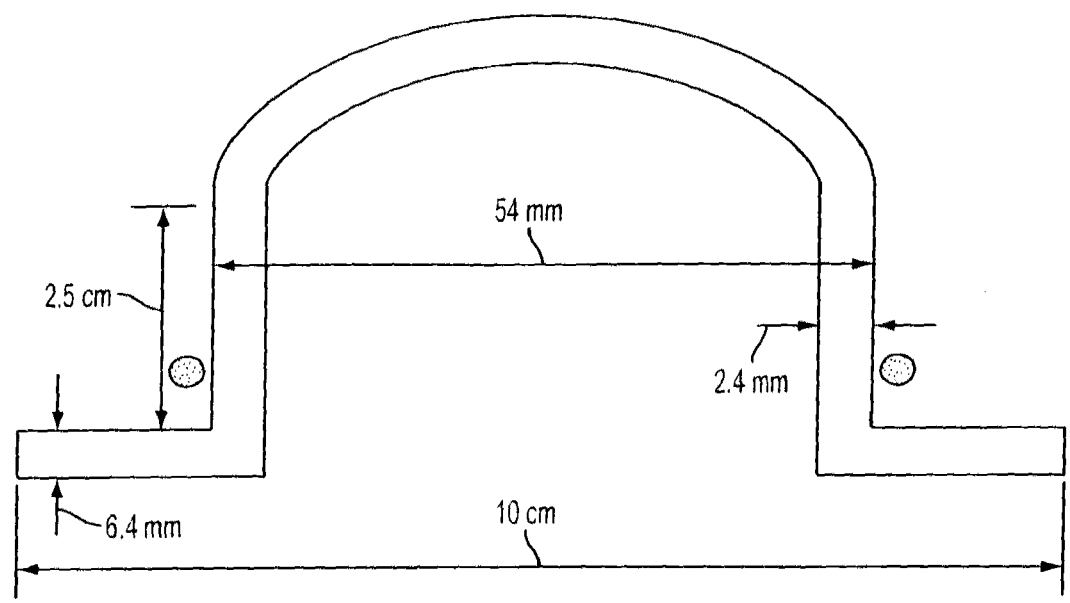
FIG. 13 is a cross-sectional schematic of an embodiment of a discharge tube according to the current invention.

In an experiment, discharge tubes 4 were configured as shown in FIG. 9. The discharge tubes 4 had the form shown in the cross-sectional schematic of FIG. 13; that is, the discharge tubes 4 had a short length, and a circular m=0 radio frequency antenna 10 surrounding each discharge tube 4 was used. A radio frequency power of 3 kW was supplied to the antennas, and the gas in the discharge tubes 4 and plenum 10 was argon. The plasma density approached $10^{12}$ cm$^{-3}$ over a 40 cm diameter area. The results of another experiment are illustrated in FIG. 12 which presents a 3-dimensional plot of plasma density in a cross-section of the plenum perpendicular to the axis running through the plenum. The density was uniform over the cross section to within +/−3%.

The embodiments illustrated and discussed in this specification are intended only to teach those skilled in the art the best way known to the inventors to make and use the invention. Nothing in this specification should be considered as limiting the scope of the present invention. All examples presented are representative and non-limiting. The above-described embodiments of the invention may be modified or varied, without departing from the invention, as appreciated by those skilled in the art in light of the above teachings. It is therefore to be understood that the scope of the invention includes all such variations and modifications, as defined by the claims and equivalents thereof.

EXAMPLE 3

Plasma processing is used in many industries for etching, deposition, or modification of materials. In the semiconductor industry, plasma etching is essential for creating the submicron features of a chip. The plasma reactors commonly used are Capacitively Coupled Plasmas (CCPs), Inductively Coupled Plasmas (ICPs), and Electron Cyclotron Resonance (ECR) reactors. These machines are designed for substrates no larger than 300 mm in diameter. For much larger substrates, there are two primary approaches. One is to use a serpentine antenna which zigzags in a plane above the substrate and applies radiofrequency (RF) power inductively. Because of the length of the antenna, this method has problems with non-uniform power deposition due to transmission line effects. The other way is to use an array of small RF sources spaced above the substrate in such a way that the plasma diffuses to uniform density at the substrate level. This embodiment of the invention concerns a plasma source that utilizes multiple helicon discharges, which are known for their high ionization efficiency. Furthermore, the dc magnetic field required by helicon sources is supplied by permanent magnets rather than a large electromagnet. The permanent magnets, coupled with small discharge tubes, permit the design of a vertically compact source which can cover an arbitrarily large substrate with dense, uniform plasma. The reactor can be used for fast etching or deposition onto plastic rolls in web coaters, glass substrates for flat LCD displays, plastic substrates for flexible or OLED displays, optical coatings, or solar cells. Where plasma processing is required, this source will increase the processing speed by a factor of two to ten over existing devices. For sensitive substrates, this source can provide a less corrosive plasma. For flat displays now made by wet etching, this dry-etch source can greatly reduce the hazardous liquid waste.

The concept that an array of small sources can be used to cover a large area has been proposed previously (F. Heinrich, U. Bänziger, A. Jentzsch, G. Neumann, and C. Huth, *Novel high-density plasma tool for large area flat panel display etching*, J. Vac. Sci. Technol. B 14, 2000 (1996); S. G. Park, C. Kim, and B. H. O, *An array of inductively coupled plasma sources for large area plasma*, Thin Solid Films 355, 252 (1999); S. G. Park, B. H. O, M. Sohn, and J. Kim, *Large area high density plasma source by helical resonator arrays*, Surface and Coatings Technol. 133, 598 (2000)). Single helicon discharges have been shown to perform excellently in an industrial environment (G. R. Tynan, A. D. Bailey III, G. A. Campbell, R. Charatan, A. de Chambrier, G. Gibson, D. J. Hemker, K. Jones, A. Kuthi, C. Lee, T. Shoji, and M. Wilcoxson, *Characterization of an azimuthally symmetric helicon wave high density plasma source*, J. Vac. Sci. Technol. A15, 2885 (1997)). That an array of helicon discharges can produce a very uniform, large-area plasma has been demonstrated (F. F. Chen, J. D. Evans, and G. R. Tynan, *Design and performance of distributed helicon sources*, Plasma Sources Sci. Technol. 10, 236 (2001)). Helicon array sources using large electromagnets have subsequently been reported (Y. J. Kim, S. H. Han, W. Hwang, and Y. S. Hwang, *Development of a large-area, multi-helicon rectangular plasma source for TFT-LCD processing*, Thin Solid Films 435, 270 (2003); C. Watts, *Alpha: A large-area plasma helicon array*, Rev. Sci. Instrum. 75, 1975 (2004)). A method to replace large electromagnets with small permanent magnets was invented by the author (F. F. Chen, PCT/US2006/024565 to which the current application claims priority; and F. F. Chen and H. Torreblanca, *Large-area helicon plasma source with permanent magnets*, Plasma Phys. Control. Fusion 49, A81 (2007)). A unique feature of that invention is the use of the remote, reverse field of permanent magnets, which allows injection of the plasma into a processing chamber before the plasma is lost to the tube walls. The use of permanent magnets saves both space and power in a helicon reactor. This embodiment of the current invention combines the features of helicon discharges, array sources, and permanent magnets to produce a compact reactor for large substrates, and furthermore can solve the problems in hardening the components for industrial use. A design is given for a modular array source that can be manufactured and duplicated to cover an arbitrarily large area with uniform plasma.

Detailed Description of the Helicon Array Plasma Source in this Embodiment

Figure 14:
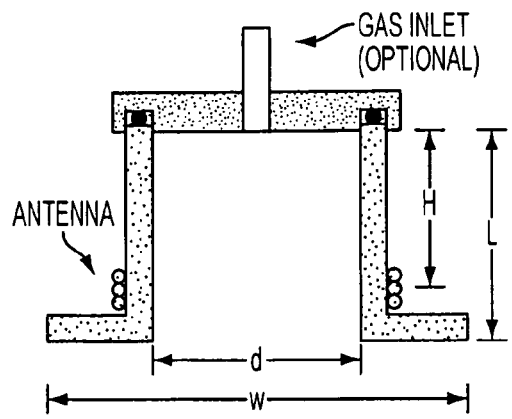
FIG. 14 illustrates an optimized tube according to an embodiment of the current invention.

1. Design of the discharge tubes. The individual tubes of the array were optimized by maximizing the plasma loading resistance $R_p$ using the HELIC (D. Arnush, *Role of Trivelpiece-Gould Waves in Antenna Helicon Wave Coupling*, Phys. Plasmas 7, 3042 (2000)) computer code based on analytic theory. An optimized tube according to this embodiment of the current invention is shown in FIG. 14.

Figure 15:
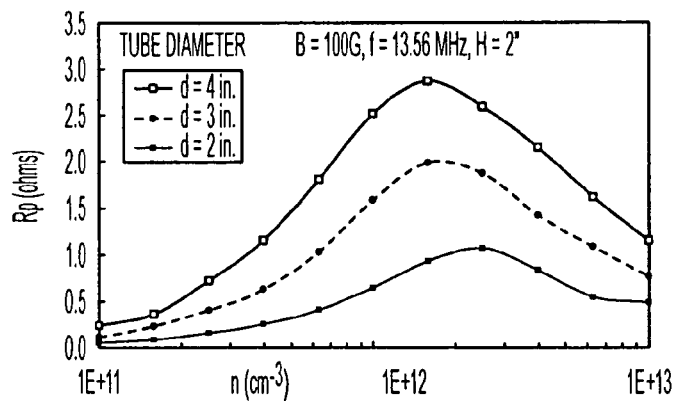
FIG. 15 is an example of the variation of $R_p$ with plasma density n for a given magnetic field B, frequency f, and the distance H between the midplane of the antenna and the top plate according to an embodiment of the current invention.
Figure 16:
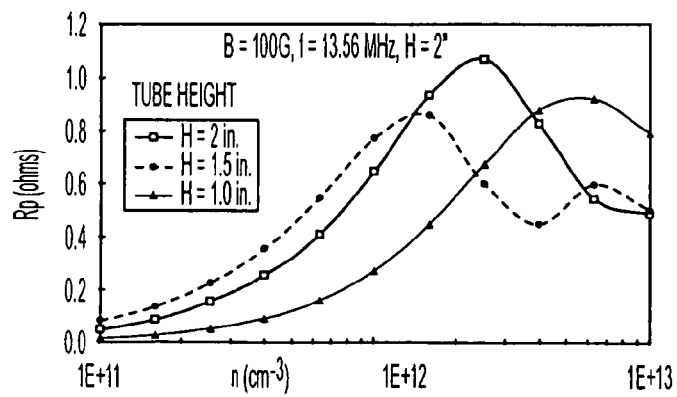
FIG. 16 shows the variation of $R_p$ with H for d about 2 inches.
Figure 17:
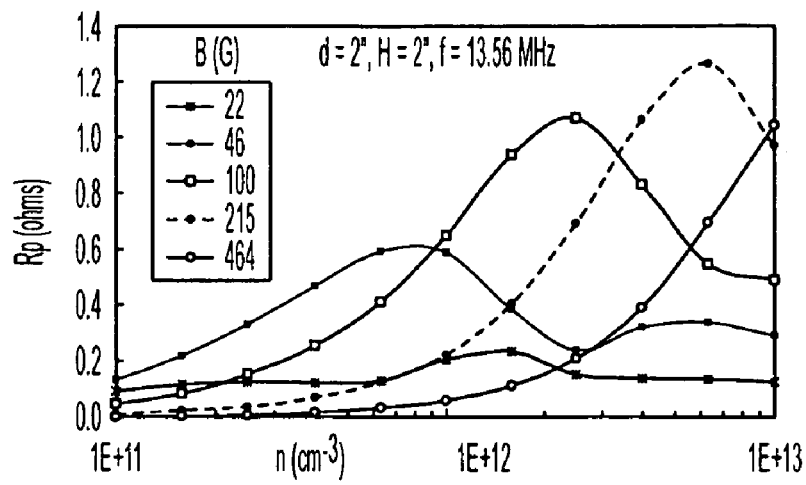
FIG. 17 shows a peak occurring at a density proportional to the magnetic field B according to an embodiment of the current invention.
Figure 18:
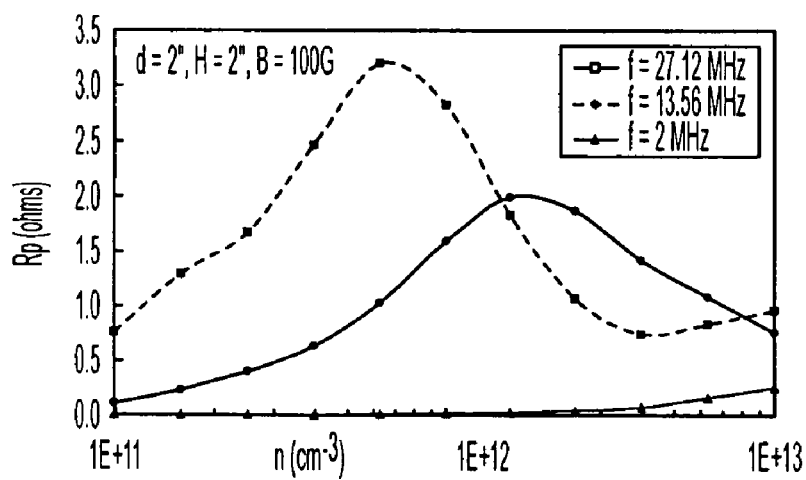
FIG. 18 shows that $R_p$ is much higher at the standard frequency of 13.56 MHz than at low frequencies such as 2 MHz, according to an embodiment of the current invention.

The diameter d of each tube is a compromise between small d, which yields small $R_P$, and large d, which has large $R_p$ but produces large plasmas that require a large diffusion distance before they merge into uniformity. FIG. 15 is an example of the variation of $R_p$ with plasma density n for a given magnetic field B, frequency f, and the distance H between the midplane of the antenna and the top plate. A pressure of 3 mTorr of argon is assumed; it is not critical. Though $R_p$ is larger for d>2 in., the optimum diameter d is about 2 inches when antenna design is considered. For this diameter, $R_p$ varies with H as shown in FIG. 16, so that H should be about 2 in. These curves show a peak occurring at a density proportional to the magnetic field B. This dependence is shown in FIG. 17. This peak is formed by a constructive resonance with the backward helicon wave reflected from the endplate (F. F. Chen, *The low-field density peak in helicon discharges*, Phys. Plasmas 10, 2586 (2003)). Hence, for a given distance H, its position depends on the wave's wavelength, which in turn depends on n, B, and f The use of this resonance is an essential element of this embodiment of the current invention. The choice of magnetic field depends on the desired density at which the resonance occurs. A value of B≈100 G is convenient because it occurs at a density in the mid-$10^{12}$ cm$^{-3}$ range, which can be achieved easily. Higher B would require higher RF power $P_{rf}$ to create the required density. In FIG. 18, it is seen that $R_p$ is much higher at the standard frequency of 13.56 MHz than at low frequencies such at 2 MHz. The loading is even higher at 27.12 MHz, but the peak occurs at too low a density unless the tube dimensions are changed. Hence, the system is designed for 13.56 MHz.

The discharge tube can be of glass, quartz, or ceramic. If n is of order $10^{13}$ cm$^{-3}$ and the tube is not cooled except by radiation, its temperature will be approximately 680° C. in steady-state operation, which is higher than glass can withstand. However, either quartz or alumina can be used. The tube has a flat "skirt" at the bottom, whose purpose is to reduce the eddy currents induced in the flange onto which the tube is mounted. In the computations, the top plate of the tube has been assumed to be a metal such as aluminum which will reverse the phase of the reflected wave. An insulating top can be used, but the value of H for which the $R_p$ peak occurs will be different because of the phase change.

The antenna is a simple m=0 loop, where m is the azimuthal mode number. It is located as close as possible to the bottom of the tube and thus to the processing chamber below it. If it is located higher, much of the plasma generated will diffuse to the wall before reaching the exit aperture. Helical and Nagoya Type III antennas in principle have better RF energy coupling, but they are so long that a short tube cannot be used, and plasma is lost to the walls before reaching the processing chamber. The length L, therefore, differs from H only by the width of the antenna and the thickness of the skirt. The number of turns in the antenna is determined by the inductance presented to the matching circuit. For 13.56 MHz, three turns is optimum. Since $R_p$ is sensitive to the radius of the loop antenna, it should be thin and wound tightly onto the discharge tube. Copper tubing ⅛ in. in diameter can carry sufficient cooling water and is a convenient material for the antenna.

Figure 19:
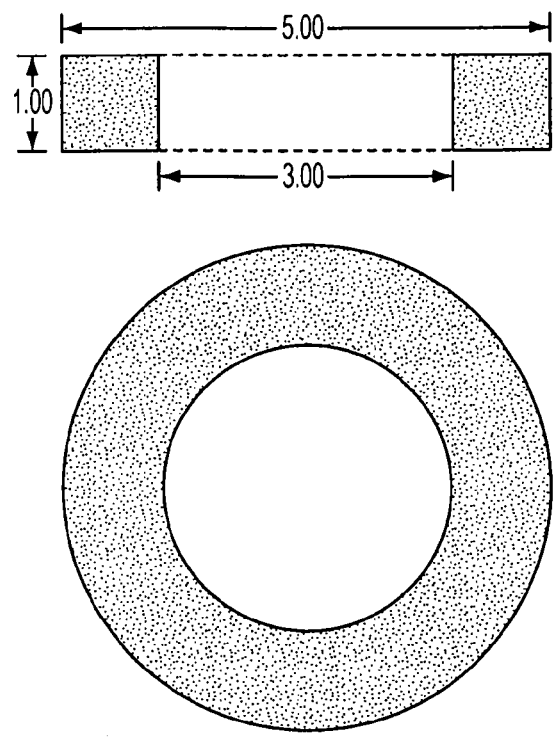
FIG. 19 shows a permanent magnet according to an embodiment of the current invention.
Figure 20:
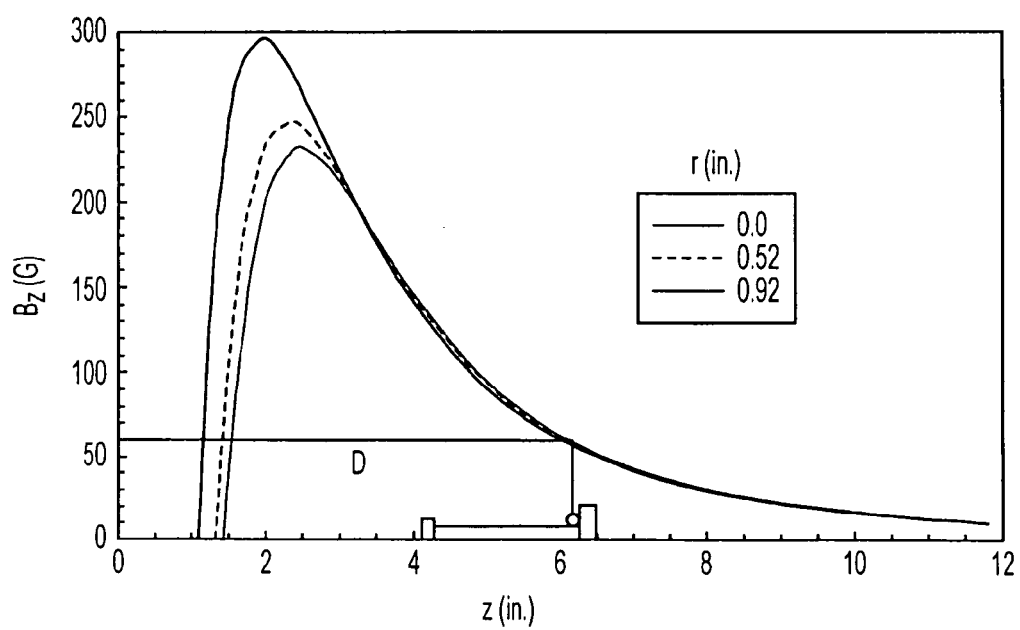
FIG. 20 shows the vertical magnetic field component $B_z(z)$ for the reverse-field region at three distances r from the axis for the magnet of FIG. 19.
Figure 21:
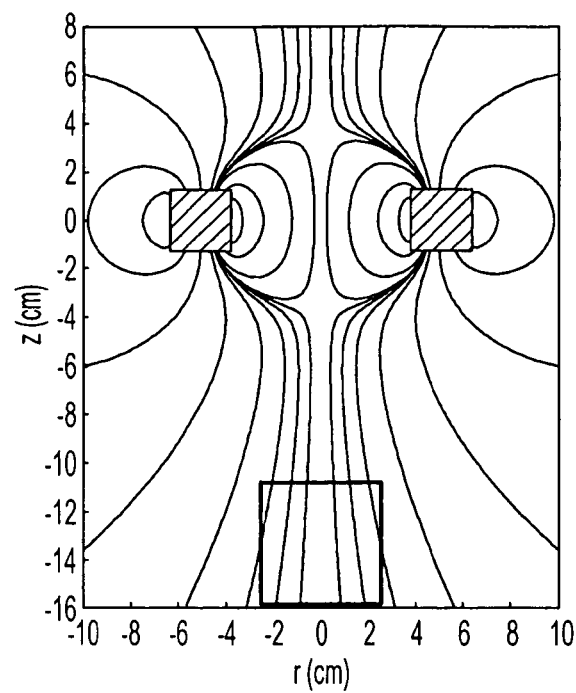
FIG. 21 shows the field lines of the magnet of FIG. 19 (the position of the plasma volume in this example is shown by the bottom rectangle)
Figure 22:
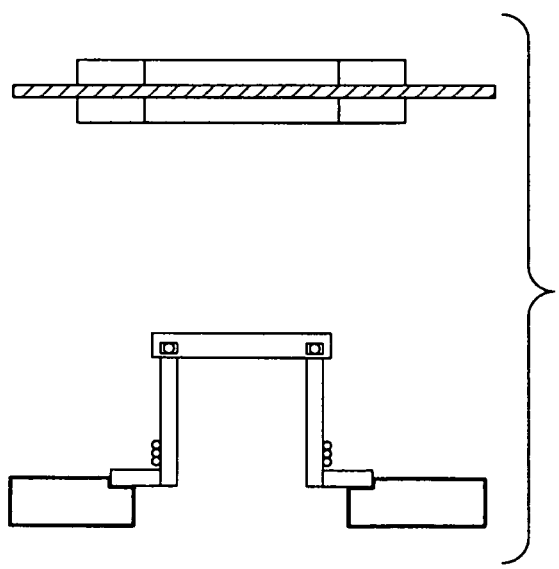
FIG. 22 shows the tube and the magnet in their relative positions for the example FIG. 19-21.

2. Design of the permanent magnets. It has been shown that by putting the discharge tube in the remote field below an annular permanent magnet it is possible to eject the plasma into a processing chamber. Neodymium (NeFeB) magnets have the highest field strength (12.8 kG) and are the easiest to fabricate. A size commensurate with a 2-in. diameter tube is a ring magnet of 3 in. ID and 5 in. OD (FIG. 19). A thickness of 0.75-1.0 in. gives an appropriate field strength at a distance D below the magnet. This distance, between the midplanes of the magnet and the antenna, is a compromise between high uniformity at large D and high field at small D. A typical range of D is 4-10 inches. The vertical magnetic field component B(z) is shown in FIG. 20 for the reverse-field region at three distances r from the axis. In the far-field region, $B_z$ is very uniform radially. As an example, consider a tube placed so that $B_z$ at its center is about 80 G. This position is shown by the sketch at the bottom. The field $B_z$ then varies from ~120 G at the top plate to ~60 G at the antenna. The field lines of the magnet are shown in FIG. 21, and the position of the plasma volume in this example is shown by the bottom rectangle. The tube and the magnet are shown in their relative positions for this example in FIG. 22. The magnet can be supported by an iron sheet or, as in this drawing, divided into two halves placed on either side of an aluminum or other non-magnetic sheet.

A disk magnet can be used, but a ring magnet is preferred for several reasons: a) a ring is easier to handle than a disk; b) the magnetic material inside the hole does not contribute much to the magnetic field in the remote region, and c) less magnetic material is needed for a ring.

Figure 23:
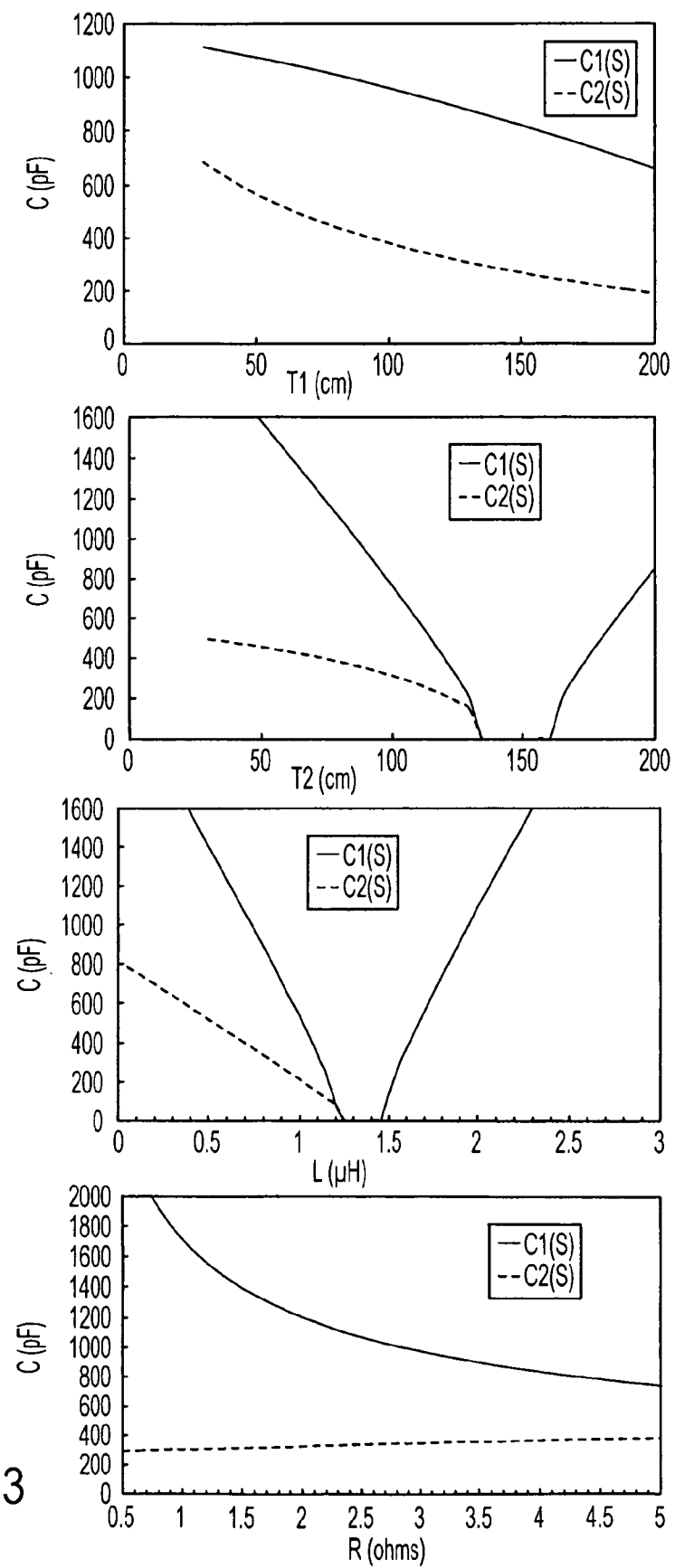
FIG. 23 shows the load ($C_1$) and tuning ($C_2$) capacitances as $T_1$, $T_2$, L, and R are varied in typical operation for N=8 and a standard (S) circuit.

3. Design of the RF system. Though small individual power supplies for each tube can be made, a single RF power supply and matching circuit for each set of, say, eight tubes will be less subject to failure and require less maintenance. The matching circuit for an array system poses several problems not present for single-tube systems. First, the distance from the matching circuit to the farthest tube will necessarily be large enough that the impedance of the antenna will be affected by the cable length. Second, these cable lengths will be different from one tube to another, and one cannot match to all tubes at the same time. Third, connecting the tubes in series does not distribute the power evenly, and connecting them in parallel gives a very low impedance. The problem can be solved in two ways, both with a parallel connection.

a) The RF power supply is connected to a junction box via a cable of length $T_1$. At the junction box, the power is fed to N tubes via cables of equal length $T_2$, each of which goes to one antenna. The voltage and current requirements on the cables and connectors are most severe when operating at low power, before the discharges jump into the helicon mode; then almost the entire power is dissipated in the circuitry. Since the phase angle is almost 90°, the peak-to-peak voltage can exceed 5 kV, and the RMS current can exceed 20 A per tube. No cable connectors can be used, since they are subject to arcing at these voltages. Connections have to be made mechanically or soldered. Cables such as RG393 can hold off the voltage, but they will overheat in DC operation. Hence, the cables need to be rigid coax, particularly the cable $T_1$, which has to carry the order of 200 A to all N tubes. The matching circuit can be a simple two-capacitor network in a standard (Pi) or alternate (Tee) configuration. The required values of capacitances can be calculated from algebraic formulas (F. F. Chen, *Capacitor tuning circuits for inductive loads*, UCLA Rept. PPG-1401 (unpublished, 1992)). For N=8 and a standard (S) circuit the load ($C_1$) and tuning ($C_2$) capacitances are shown in FIG. 23 as $T_1$, $T_2$, L, and R are varied in typical operation. Here L and R are the inductance and resistance of each tube, including the antenna and the plasma impedances. Note that $T_2$ and L have an upper limit above which no matching is possible.

Figure 24:
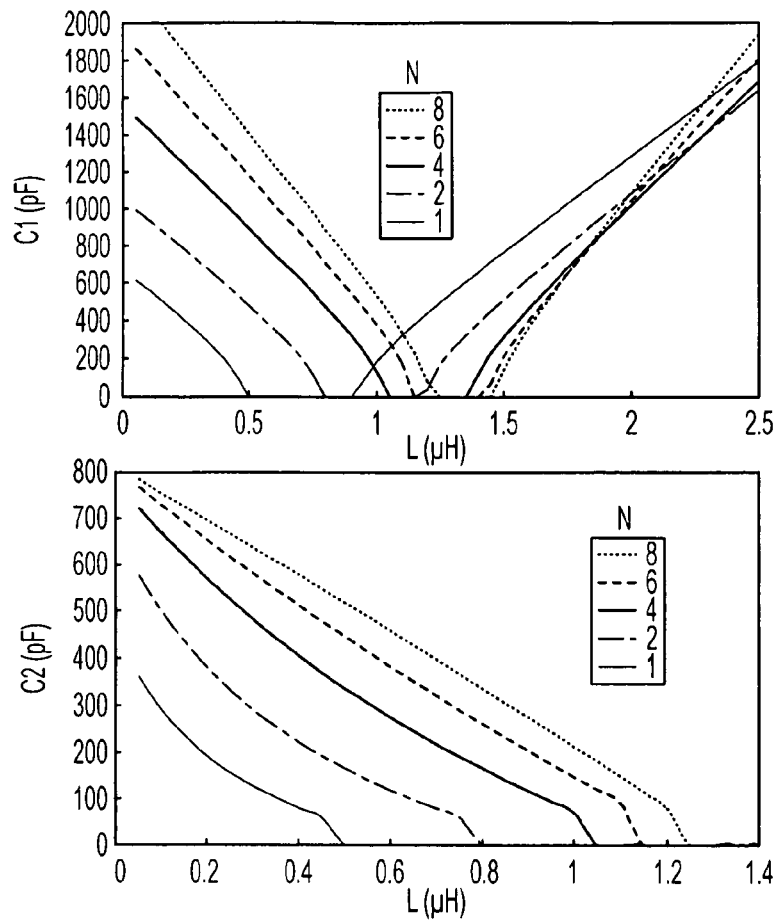
Figure 25:
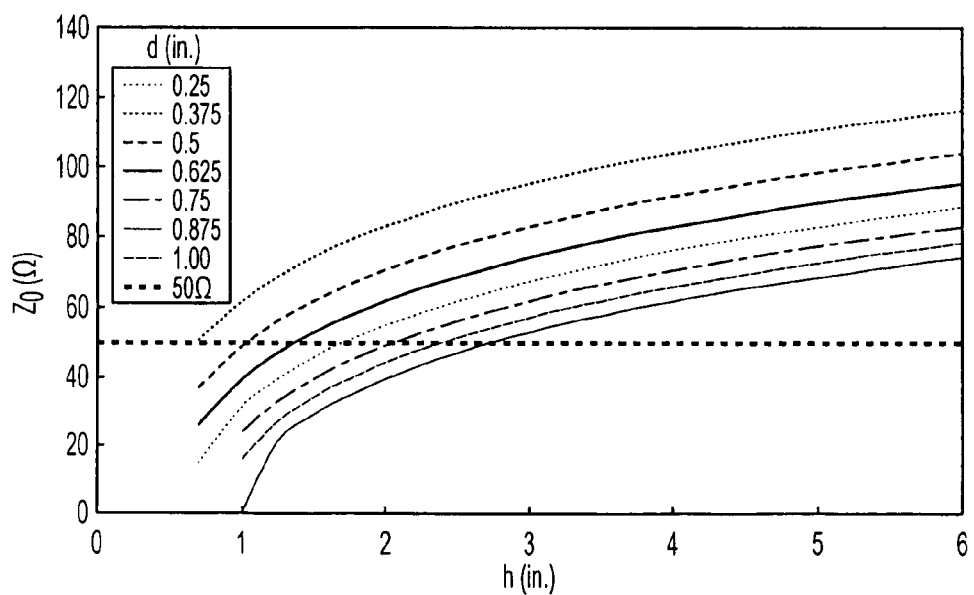
FIG. 25 shows the value of $Z_0$ vs. h for various outside diameters d of the central tube (w>>h)
Figure 26:
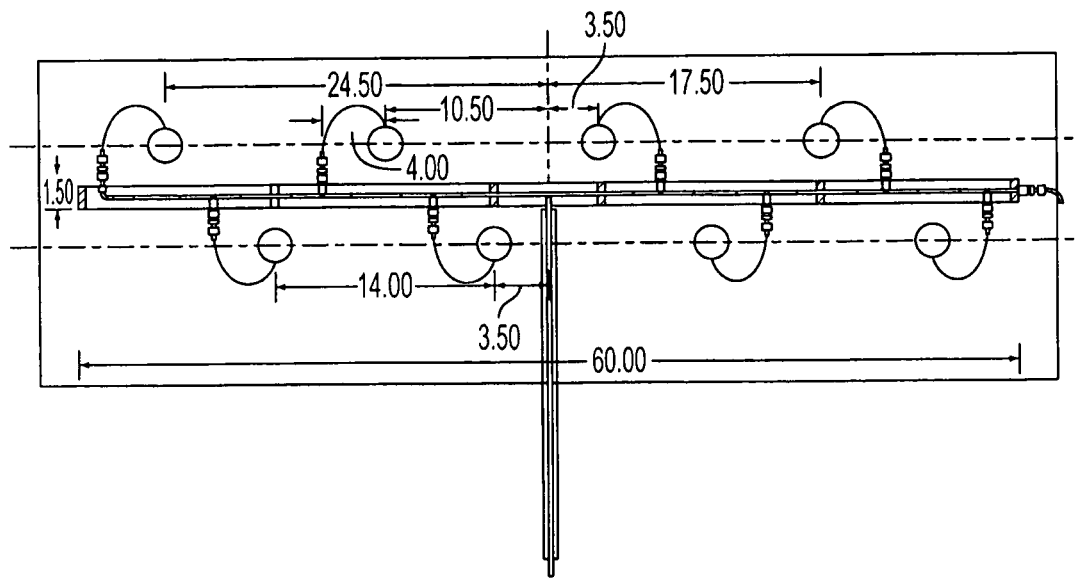
FIG. 26 shows such a transmission line corresponding to FIG. 25 with d=0.24 in., h=1 in., and w=1.5 in. feeding a staggered array of eight tubes.
Figure 27:
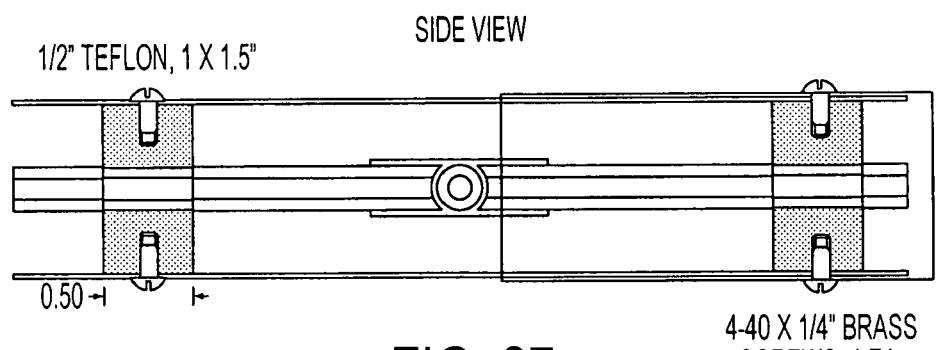
FIG. 27 is a side view of a section of the line showing a soldered T-joint connection to an antenna lead.
Figure 28:
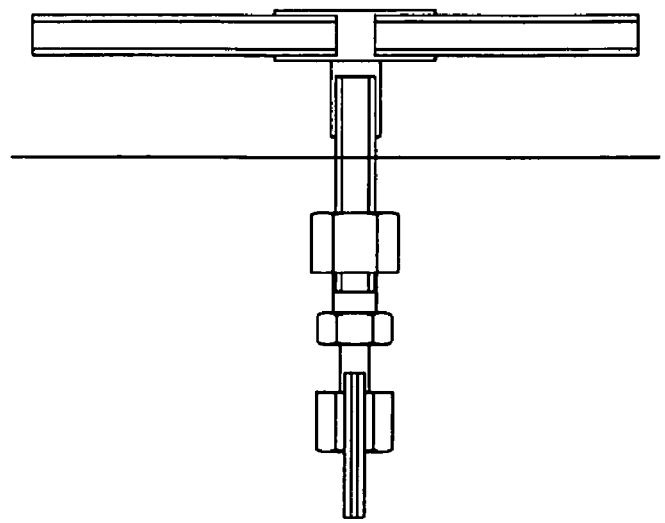
FIG. 28 shows a connector between the ¼-in. OD tube from the T-joint and the ⅛-in. OD antenna tube.
Figure 29:
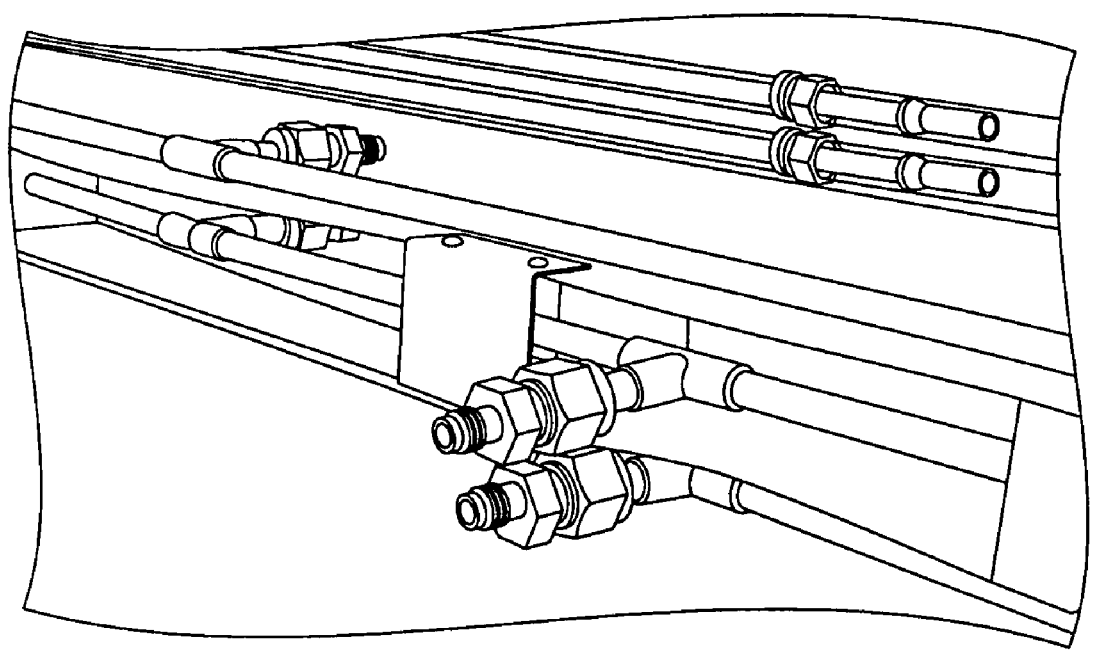
FIG. 29 is a photograph of a section of the line showing the water connections.

The matching network depends critically on the number of tubes N. The values of $C_1$ and $C_2$ in the standard configuration with $T_1$=44 in. and $T_2$=36 in. are shown in FIG. 24. It is not possible in this case to match to one or two tubes. The antennas are water-cooled in series in such a way that the high-voltage side of one antenna is connected to the high-voltage side of the next, so that no high voltage appears across the water. This assumes an even number of tubes.

b) This method uses a hybrid transmission line which carries both the water and the RF power. The line is rectangular, with a central conductor consisting of a copper tube and top and bottom strips of width w separated by a distance h. Though not necessary, it is desirable to have the impedance $Z_0$ of the line near 50Ω. If w>>h, the value of $Z_0$ vs. h is shown for various outside diameters d of the central tube in FIG. 25. For instance, FIG. 26 shows such a transmission line with d=0.24 in., h=1 in., and w=1.5 in. feeding a staggered array of eight tubes. FIG. 27 is a side view of a section of the line showing a soldered T-joint connection to an antenna lead. The ground planes of the line are separated by teflon® blocks, and the sides are covered with copper sheet between antenna feeds. FIG. 28 shows a connector between the ¼-in. OD tube from the T-joint and the ⅛-in. OD antenna tube. Both water and RF are carried through this joint. FIG. 29 is a photograph of a section of the line showing the water connections. Cooling water enters the line in the ¼-in. pipe soldered to the upper ground plane, goes through the antenna, and leaves in a similar ¼-in. pipe soldered to the lower ground plane. In order that no high voltage appears across the water path, the antennas are water-cooled in pairs. Water enters from the top ground plane to the ground side of the first antenna and leaves on the high-voltage side, which is connected to the center conductor of the line. Water enters the second antenna on the high-voltage side connected to the center conductor and leaves on the ground side connected to the lower ground plane. The water in the center tube is at high voltage but never touches ground except through the small diameter antenna tubing.

The transmission line is connected to the matching network through another cooled line. The circuit resistance is much lower than with cables, and the tubes and connections can carry the requisite current. The antennas are now at different distances from the feed point, so that the amplitude and phase of the RF at each antenna is slightly different. Nonetheless, calculations (F. F. Chen and H. Torreblanca, *Density jump in helicon discharges*, Plasma Sources Sci. Technol. 16, 593 (2007)) show that if the circuit resistance is sufficiently low compared with the plasma loading resistance, all tubes can receive essentially the same RF power.

Figure 30:
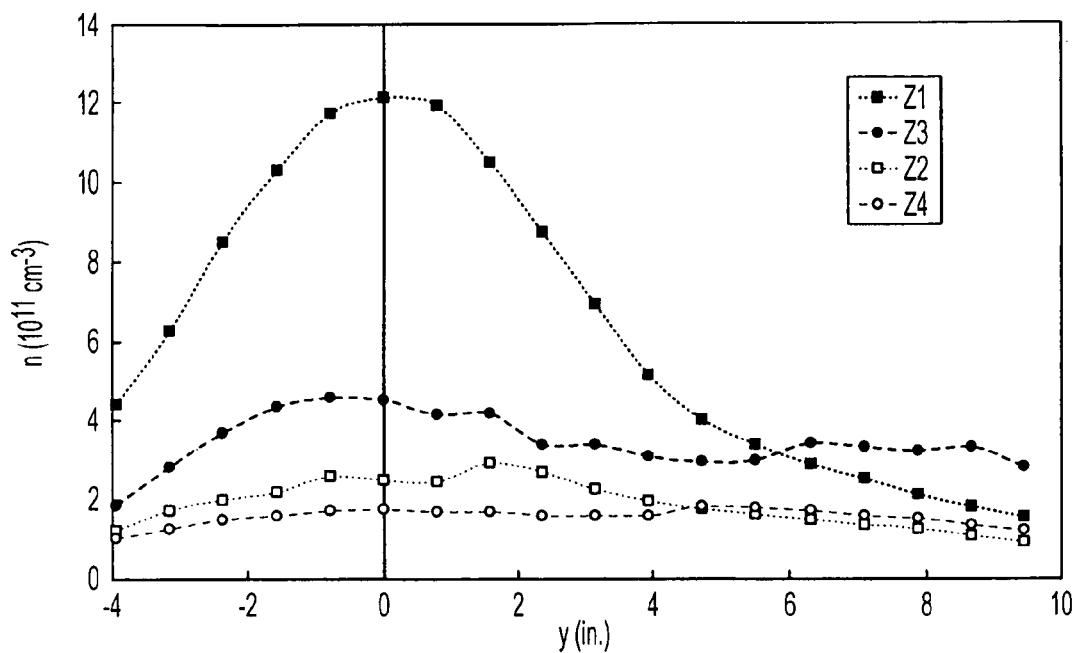
FIG. 30 shows density measurements across a test array in staggered configuration (see FIG. 26) at distances $Z_1$=2.9 in. and $Z_3$=6.9 in. below the tube.
Figure 31:
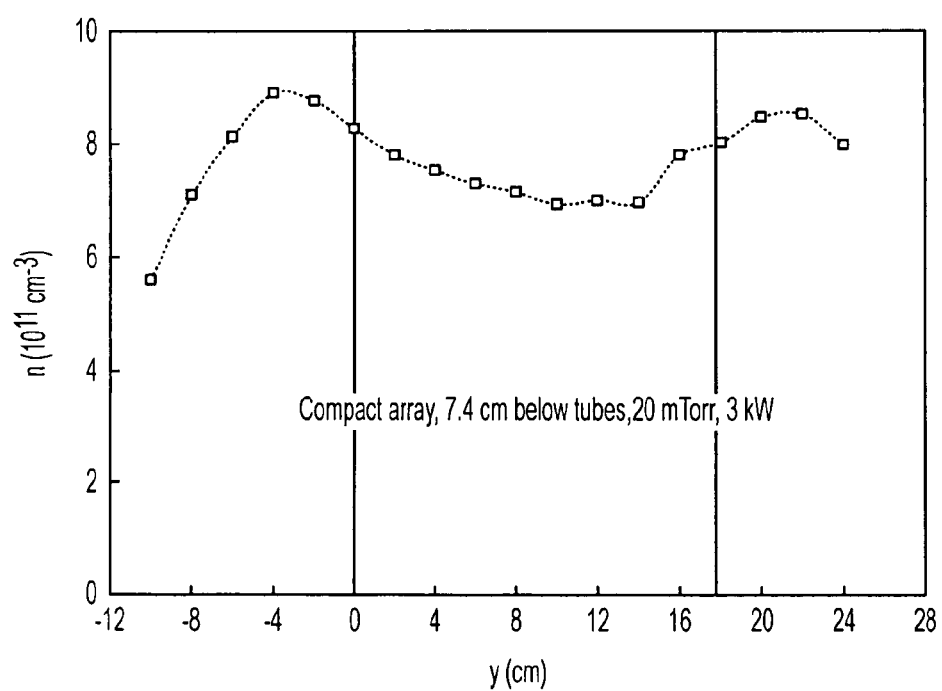
FIG. 31 shows measurements of the density in a test array in a compact configuration, as shown in Section D.

4. Measurements of a test array. Density measurements across a test array in staggered configuration (FIG. 26) at distances $Z_1$=2.9 in. and $Z_3$=6.9 in. below the tube are shown in FIG. 30. The two rows are 7 in. apart, and the tubes in each row are 14 in. apart. Probes at $Z_1$ and $Z_2$ pass directly under one tube in the near row into the space between tubes in the second row. This shows the tradeoff between density and uniformity as the distance z below the tubes is varied. Also shown in FIG. 30 are profiles at $Z_3$ and $Z_4$, which are probe positions at x=3.5 in. from $Z_1$ and $Z_2$, in the space between tubes in both rows. In a web-coater in which the substrate passes under the two rows in the y direction, the average density impinging on the substrate is calculated to be extremely uniform (within 1%). Data were taken at 3 kW, 100 mTorr. Measurements of the density in a test array in a compact configuration, as shown in Section D, are shown in FIG. 31.

D. Design of a Compact Modular Source

Figure 32:
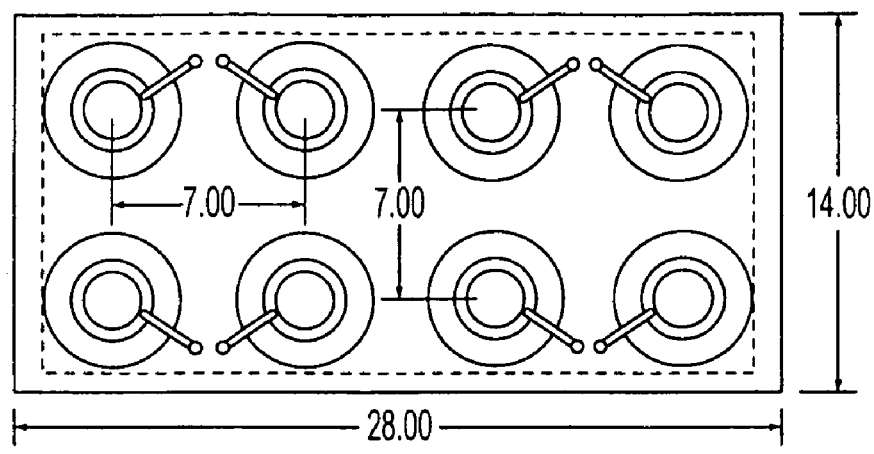
FIG. 32 shows an eight-tube module according to an embodiment of the current invention.
Figure 33:
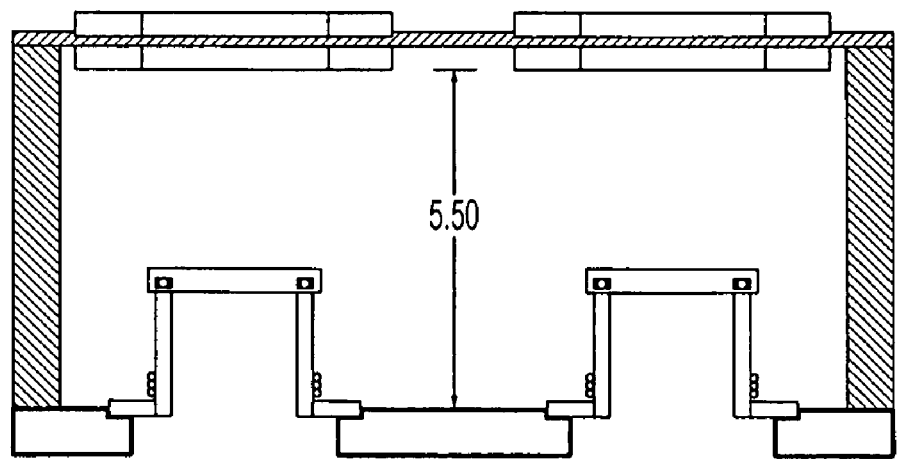
FIG. 33 shows a side view of the module of FIG. 32 from the end.

A helicon array source can be manufactured as a self-contained module such that an arbitrarily large area can be covered uniformly with dense plasma by an array of such modules. Each module can have N tubes, where N=4, 6, 8, 10, or any even number. For example, an eight-tube module is shown in FIG. 32. A number of such modules can be arranged in a rectangular array, or side-by-side to obtain a linear plasma, while maintaining equal spacing between the tubes. In each tube, the inner circle is the plasma, and the outer annulus is the magnet above it. The spacing of the tubes can be varied depending on the application. A side view of the module from the end is shown in FIG. 33. The discharge tubes are mounted onto the top plate of a processing chamber, and the magnets are held above them by an aluminum plate. The magnets in the example are ¾ in. thick, divided into two ⅜-in thick rings. The magnetic field can be varied by adjusting the lengths of the supports. This part of the module is only of the order of six inches high, and it can be mounted sideways to process vertical substrates.

Figure 34:
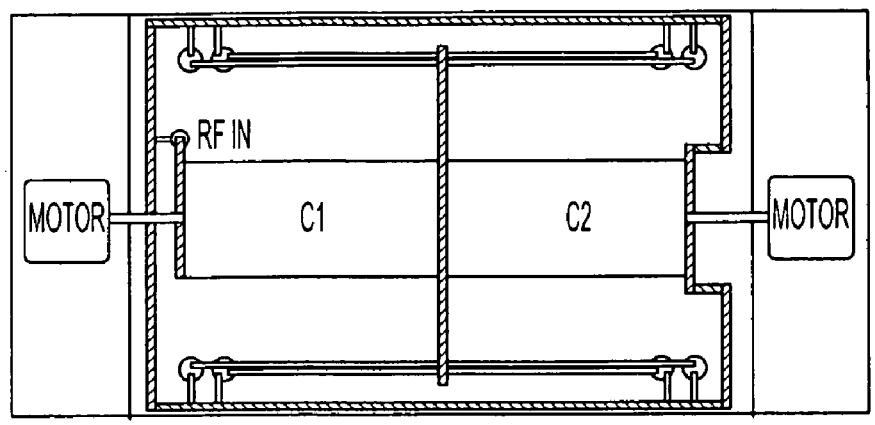
FIG. 34 shows a top view of the match box corresponding to FIG. 33.
Figure 35:
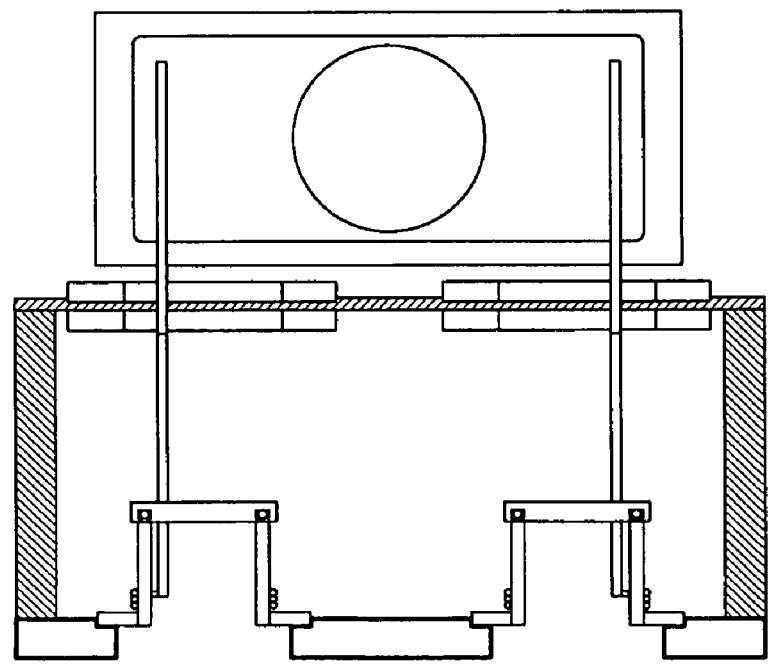
FIG. 35 shows an end view of the match box in relation to the tubes and magnets.

The matching circuit for the module is designed to avoid problems with long and varying cable lengths to each antenna. A top view of the match box is shown in FIG. 34. The capacitors $C_1$ and $C_2$ are arranged in the alternate (Tee) configuration and their values are such that they can handle the voltages and currents at 5 kW before breakdown, when the entire RF power is dissipated in the circuitry. The physical sizes of the capacitors are determined by standard available units such as Jennings CVDD-400-15S, 20-400 pF, 9 kV at 80 A for $C_1$ and Jennings CVCD-1500-3S, 10-1500 pF, 1.8 kV at 80 A for $C_2$. These are sized so that the match circuit fits within the footprint of a module. FIG. 35 shows an end view of the match box in relation to the tubes and magnets. The antenna leads at 45° azimuth (FIG. 32) rise vertically into the match circuit (FIG. 35) through the magnet support sheet and are soldered onto the copper sheet separating $C_1$ and $C_2$ (FIG. 34). Thus the cable lengths to each antenna are short and essentially equal. The ground leads of the antennas are soldered to the ground plane inside the match box (FIG. 34). The dashed line in FIG. 32 shows the footprint of the match box in each module. The water connections to the antennas are arranged as in Sec. C3 so that no high voltage appears across the water path. A 3-5 kW RF power supply at 13.56 MHz feeds each matching circuit. These water-cooled supplies can be located remotely from the modules.

E. Possible Enhancements of the Tube Design

Figure 36:
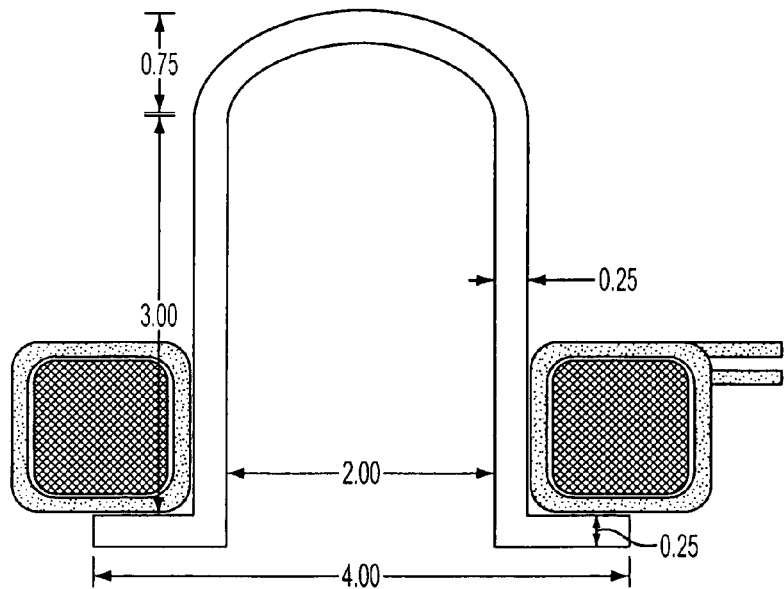
FIG. 36 shows another embodiment of a tube according to the current invention.
Figure 37:
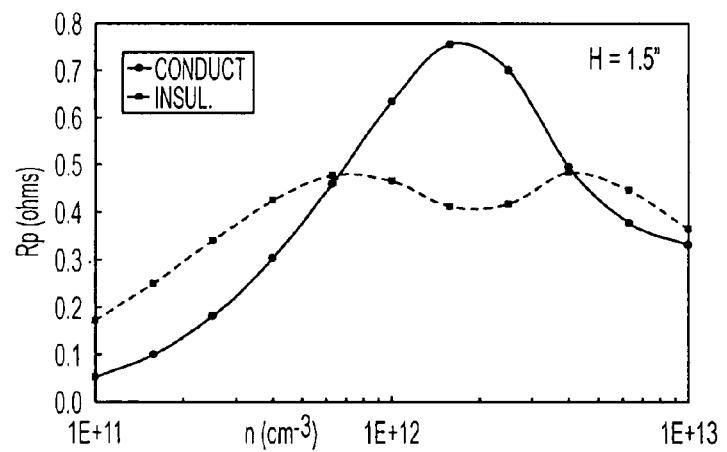
FIG. 37 compares the plasma loading resistance vs. density for tubes with insulating and conducting top plates according to an embodiment of the current invention.
Figure 37:
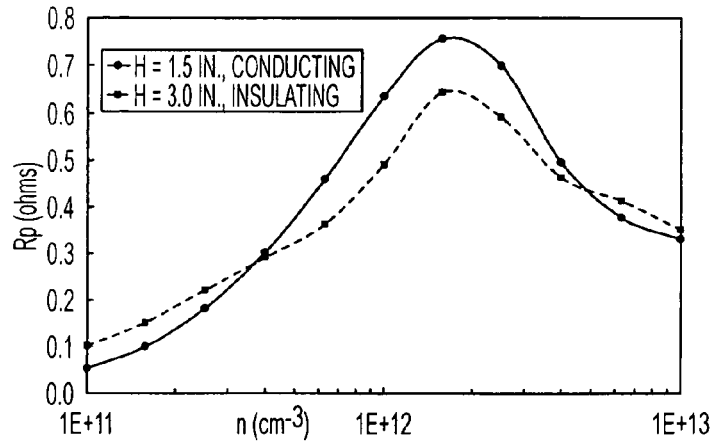

1. Ceramic tubes. The O-ring sealing the top plate of each tube can be eliminated by using an alumina tube as shown in FIG. 36. The length L of the tube has to be changed to obtain the low-field peak resonance condition because of the reversal of the helicon phase compared to a tube with a conducting top plate. FIG. 37 compares the plasma loading resistance vs. density for tubes with insulating and conducting top plates. In the top graph of FIG. 37, it is clear that $R_p$ is much lower for the insulating top if H is 1.5 in. for both. However, if H is changed to 3.0 in., the insulating top can perform almost as well as the conducting top. This is the tube shown in FIG. 36.

Figure 38:
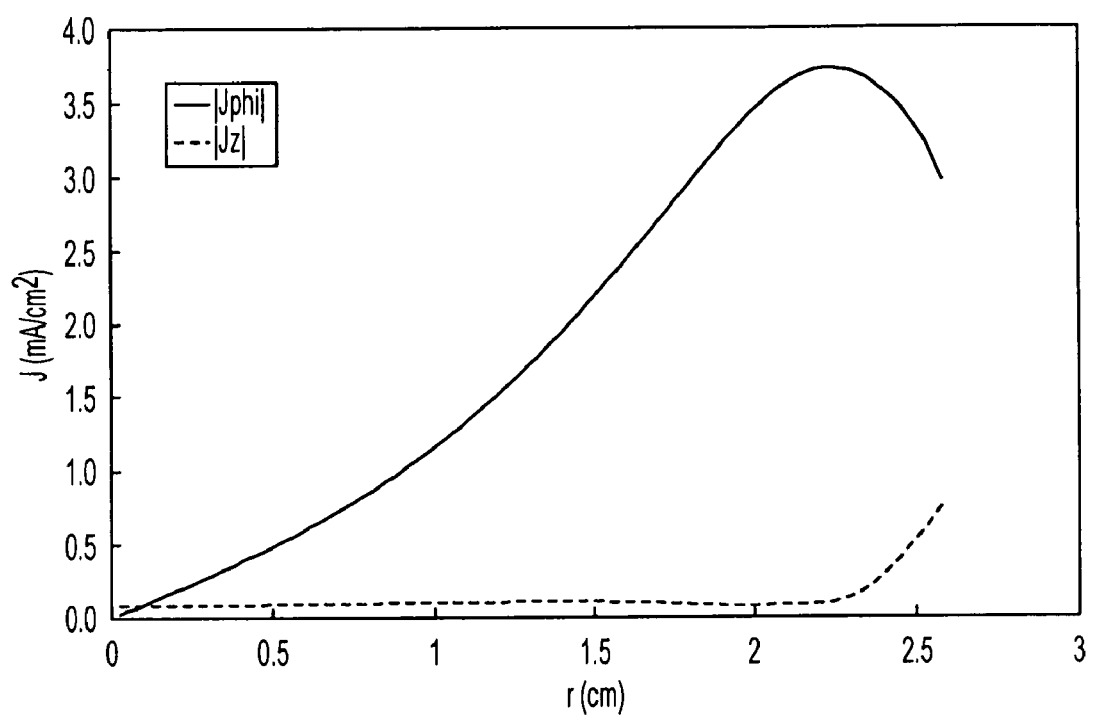
FIG. 38 shows a comparison of the relative magnitudes of the currents $J_\phi$ and $J_z$ in a helicon wave in a 2-in. diameter tube according to an embodiment of the current invention.

2. Ferrite antenna coupling. Much more efficient coupling of RF power to the antennas can by implemented by using a ferrite transformer, as shown in FIG. 36. Normally, the m=0 antenna induces an azimuthal electric field $E_\phi$ in the plasma to excite the $E_\phi$ component of the helicon wave. With a transformer wound as in FIG. 36, a longitudinal field $E_z$ is induced in the plasma. FIG. 38 shows a comparison of the relative magnitudes of the currents $J_\phi$ and $J_z$ in a helicon wave in a 2-in. diam tube. Both are peaked near the edge, where the antenna is. The current $J_z$ is weaker than $J_{p\phi}$, but by driving it with $E_z$, the larger current $J_\phi$ will arise in the plasma due to the helicon dispersion relation. Furthermore, since a transformer can be wound so that the 50-Ω output of the power supply matches the plasma resistance $R_p$, no matching network may be necessary (V. A. Godyak, *New ICP Technology for Semiconductor Material Processing*, Presentation given at the Plasma Etch Users Group, Santa Clara, September 2003).

All references cited anywhere in this specification are hereby incorporated by reference.

References

[1] R. W. Boswell, *Plasma production using a standing helicon wave*, Phys. Lett. A 33, 457 (1970).

[2] F. F. Chen and D. D. Blackwell, *Upper limit to Landau damping in helicon discharges*, Phys. Rev. Lett. 82, 2677 (1999).

[3] F. F. Chen, *Plasma ionization by helicon waves*, Plasma Phys. Control. Fusion 33, 339 (1991).

[4] F. F. Chen, *Helicon Plasma Sources*, in "High Density Plasma Sources", ed. by Oleg A. Popov (Noyes Publications, Park Ridge, N.J.), Chap. 1 (1995).

[5] R. W. Boswell and F. F. Chen, *Helicons, the early years*, IEEE Trans. Plasma Sci. 25, 1229 (1997).

[6] F. F. Chen and R. W. Boswell, *Helicons, the past decade*, IEEE Trans. Plasma Sci. 25, 1245 (1997).

[7] N. Benjamin, B. Chapman, and R. Boswell, *Progress of an advanced diffusion source plasma reactor*, in "Advanced Techniques for Integrated Circuit Processing", Proceedings of SPIE 1392, 95 (1990).

[7.4] G. R. Tynan, A. D. Bailey III, G. A. Campbell, R. Charatan, A. de Chambrier, G. Gibson, D. J. Hemker, K. Jones, A. Kuthi, C. Lee, T. Shoji, and M. Wilcoxson, J. Vac. Sci. Technol. A 15, 2885 (1997).

[8] D. G. Miljak and F. F. Chen, *Helicon wave excitation with rotating antenna fields*, Plasma Sources Sci. Technol. 7, 61 (1998).

[9] L. Porte, S. M. Yun, F. F. Chen, and D. Arnush, *Superiority of half-wavelength helicon antennas*, Plasma Sources Sci. Technol. 12, 287 (2003).

[10] F. F. Chen, X. Jiang, and J. D. Evans, *Plasma injection with helicon sources*, J. Vac. Sci. Technol. A 8, 2108 (2000).

[11] F. F. Chen, *The low-field density peak in helicon discharges*, Phys. Plasmas 10, 2586 (2003).

[12] F. F. Chen, X. Jiang, J. D. Evans, G. Tynan, and D. Arnush, *Low Field Helicon Discharges*, Plasma Phys. Control. Fusion 39, A411 (1997).

[13] D. Arnush, *Role of Trivelpiece-Gould Waves in Antenna Helicon Wave Coupling*, Phys. Plasmas 7, 3042 (2000).

I claim:

1. A helicon plasma source, comprising:
   a discharge tube;
   a vacuum chamber defining an interior space that is in fluid connection with the discharge tube to receive a plasma from the discharge tube;
   a radio frequency antenna disposed proximate the discharge tube; and
   a permanent magnet positioned with respect to the discharge tube so that the discharge tube is in a far-field region of a magnetic field produced by the permanent magnet to promote injection of said plasma from said discharge tube into said vacuum chamber.

2. The helicon plasma source of claim 1, wherein the radio frequency antenna is a circular winding of m=0 symmetry.

3. The helicon plasma source of claim 1, further comprising a magnet support that is adjustably arranged with respect to the discharge tube, said permanent magnet being attached to said magnet support.

4. The helicon plasma source of claim 1, wherein the discharge tube comprises an end plate and the length of the discharge tube, material of the end plate, frequency of a radio frequency radiation emitted from the antenna, position of the radio frequency antenna, type of radio frequency antenna, and position of the permanent magnet array with respect to the discharge tube are selected so that the radio frequency radiation emitted by the antenna and reflected by an end plate of the discharge tube interfere constructively and the plasma density as a function of magnetic field exhibits a peak at a low magnitude magnetic field.

5. The helicon plasma source of claim 4, wherein the plasma density as a function of magnetic field magnitude exhibits a maximum peak in a range of from about 10 gauss to about 200 gauss.

6. The helicon plasma source of claim 1, further comprising
a radio frequency power supply,
wherein the radio frequency power supply is coupled to and matched to an impedance of the radio frequency antenna and plasma in the discharge tube.

7. The plasma souce of claim 6, wherein the radio frequency power supply generates radio frequency radiation of frequency greater than about 2 megahertz.

8. The plasma souce of claim 6, wherein the radio frequency power supply generates radio frequency radiation of frequency greater than about 10 megahertz.

9. The helicon plasma source of claim 6, wherein the radio frequency power supply generates radio frequency radiation of frequency of about 13.56 megahertz.

10. The helicon plasma source of claim 6, wherein the radio frequency power supply generates radio frequency radiation of frequency of about 27 megahertz.

11. The helicon plasma source of claim 1, further comprising:
a second discharge tube spaced apart from the first mentioned discharge tube;
a second radio frequency antenna disposed proximate the second discharge tube; and
a second permanent magnet positioned with respect to the second discharge tube so that the second discharge tube is in a far-field region of a magnetic field produced by the second permanent magnet.

12. A helicon plasma source, comprising:
a vacuum chamber;
a plurality of discharge tubes in fluid connection with an interior space of said vacuum chamber;
a plurality of radio frequency antennas each disposed proximate a respective one of said plurality of discharge tubes; and
a plurality of permanent magnets each arranged with respect to a respective one of said plurality of discharge tubes in a respective far-field region of a magnetic field produced by said each permanent magnet to promote injection of a plasma from each of said plurality of discharge tubes into said vacuum chamber.

13. The helicon plasma source of claim 12, wherein the discharge tubes are arranged as at least one a linear, rectangular, or circular array.

14. The helicon plasma source of claim 12, wherein each discharge tube is separated from another discharge tube by a predetermined space.

15. The helicon plasma source of claim 12, further comprising:
a radio frequency power supply; and
a distribution and impedance matching circuit electrically coupled to each of the plurality of radio frequency antennas and to the radio frequency power supply,
wherein said distribution and impedance matching circuit acts to equalize the radio frequency power supplied to each of the plurality of discharge tubes.

16. The helicon plasma source of claim 12, further comprising
a plurality of radio frequency power supplies, each radio frequency power supply being coupled to a respective one of the plurality of discharge tubes.

17. A method of plasma processing, comprising:
placing a discharge tube in a far field region of a magnetic field produced by a permanent magnet;
generating a plasma in the discharge tube by exposing a gas in the discharge tube to radio frequency radiation; and
exposing an object being processed to the plasma,
wherein said magnetic field produced by said permanent magnet promotes discharge of said plasma from said discharge tube.

18. The method of claim 17, further comprising maximizing a plasma density at a low magnitude magnetic field by selecting a length of the discharge tube, selecting a material of an end plate of the discharge tube, selecting a frequency of the radio frequency radiation, selecting a pattern of the radio frequency radiation, adjusting a position of the discharge tube within the magnetic field.

19. A device for producing a plasma, comprising:
a discharge tube defining a plasma discharge region;
a radio frequency antenna disposed proximate the discharge tube; and
a permanent magnet positioned with respect to the discharge tube so that the discharge tube is in a far-field region of a magnetic field produced by the permanent magnet to promote discharge of a plasma from said discharge tube through said discharge region.

20. The device according to claim 19, wherein said permanent magnet is positioned at an opposing end of said discharge tube from said plasma discharge region such that an interior space defined by said discharge tube is between said permanent magnet and said plasma discharge region.

* * * * *